United States Patent [19]

Ohtsuka

[11] Patent Number: 5,825,205
[45] Date of Patent: Oct. 20, 1998

[54] LEVEL-SHIFT CIRCUIT FOR DRIVING WORD LINES OF NEGATIVE GATE ERASABLE TYPE FLASH MEMORY

[75] Inventor: Nobuaki Ohtsuka, Menlo Park, Calif.

[73] Assignee: Kabushiki Kaisha Toshiba, Kawasaki, Japan

[21] Appl. No.: 511,446

[22] Filed: Aug. 4, 1995

[30] Foreign Application Priority Data

Aug. 9, 1994 [JP] Japan ..................................... 6-187268

[51] Int. Cl.⁶ ............................................ H03K 19/0185
[52] U.S. Cl. ................................ 326/81; 326/68; 326/83; 365/230.06
[58] Field of Search .................................. 326/68, 80, 81, 326/83, 86, 121, 17; 327/333, 208, 214; 365/230.06

[56] References Cited

U.S. PATENT DOCUMENTS

| | | | |
|---|---|---|---|
| 4,613,773 | 9/1986 | Koike ....................................... | 326/121 |
| 4,642,798 | 2/1987 | Rao ......................................... | 365/230 |
| 5,022,000 | 6/1991 | Terasawa et al. ........................ | 365/218 |
| 5,023,480 | 6/1991 | Gieseke et al. .......................... | 326/121 |
| 5,047,981 | 9/1991 | Gill et al. ................................. | 365/185 |
| 5,077,691 | 12/1991 | Haddad et al. .......................... | 365/218 |
| 5,122,985 | 6/1992 | Santin ...................................... | 365/185 |
| 5,134,449 | 7/1992 | Gill et al. ................................. | 365/218 |
| 5,168,335 | 12/1992 | D'Arrigo et al. ........................ | 365/185 |
| 5,295,102 | 3/1994 | McClure .............................. | 365/230.06 |
| 5,295,106 | 3/1994 | Jinbo ........................................ | 365/218 |
| 5,297,088 | 3/1994 | Yamaguchi .......................... | 365/230.06 |
| 5,440,249 | 8/1995 | Schucker et al. ........................ | 326/81 |
| 5,530,392 | 6/1996 | Runas et al. ............................. | 327/333 |
| 5,594,368 | 1/1997 | Usami et al. ............................. | 326/81 |

FOREIGN PATENT DOCUMENTS

| | | |
|---|---|---|
| 0 525 678 A2 | 2/1993 | European Pat. Off. . |
| 0 550 751 A1 | 7/1993 | European Pat. Off. . |
| 6-215591 | 6/1994 | Japan . |
| 2248988 | 4/1992 | United Kingdom ..................... 326/80 |

OTHER PUBLICATIONS

Nakayama et al., "A New Decoding Scheme and Erase Sequence for 5V Only Sector Erasable Flash Memory", 1992 Symposium on VLSI Circuits, Digest of Technical Papers, Jun. 4–6, 1992, pp. 22–23.

Umezawa et al., "A 5–V–Only Operation 0.6–$\mu$m Flash, EEPROM with Row Decoder Scheme in Triple–Well Structure", IEEE Journal of Solid–State Circuits, vol. 27, No. 11, Nov. 1992, pp. 1540–1545.

*Primary Examiner*—Jon Santamauro
*Attorney, Agent, or Firm*—Banner & Witcoff, Ltd.

[57] ABSTRACT

A level-shift circuit includes first and second inverting circuits, first and second inverting circuits each operated with a voltage between a potential higher than a power supply potential and a potential lower than the ground potential used as a power supply voltage. The input terminal of the first inverting circuit is connected to the output terminal of the second inverting circuit, and the output terminal of the first inverting circuit is connected to the input terminal of the second inverting circuit. Current paths of first and second MOS transistors are serially connected between the input terminal of the first inverting circuit and the ground and the gate of the second transistor is supplied with an input signal whose high level is set at the power supply potential and whose low level is set at the ground potential. Current paths of third and fourth MOS transistors are serially connected between the input terminal of the second inverting circuit and the ground. A first inverter converts the low level of an erasing signal to a potential lower than the ground potential and supplies the level-converted signal to the gates of the first and third transistors. A second inverter is supplied with the input signal and supplies an inverted signal of the input signal to the gate of the fourth MOS transistor. The level-shifted output is output from at least one of the output terminal of the first inverting circuit and the output terminal of the second inverting circuit.

48 Claims, 9 Drawing Sheets

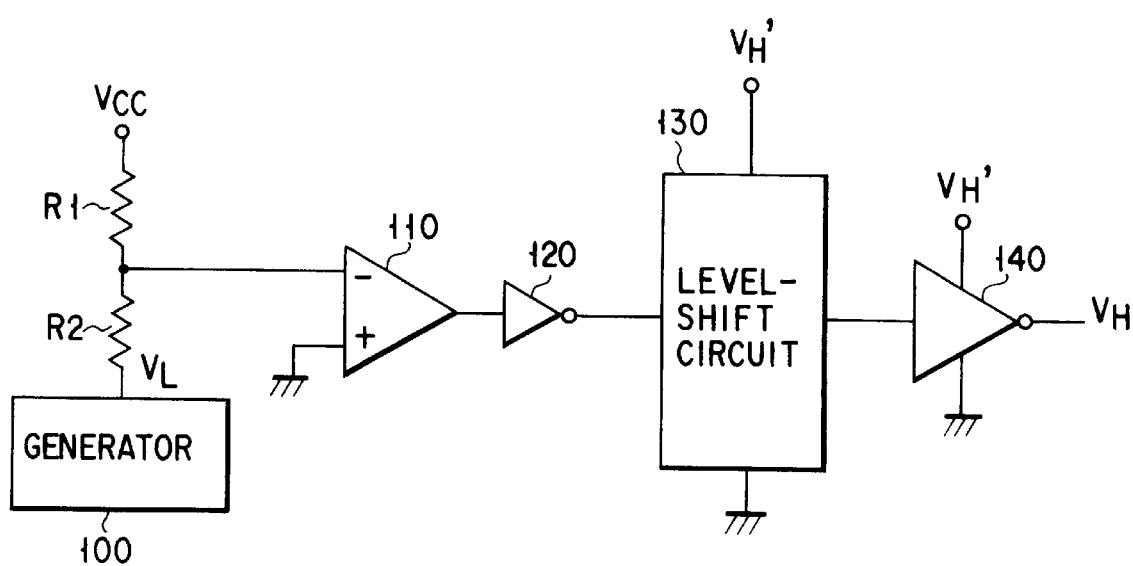
F I G. 10B

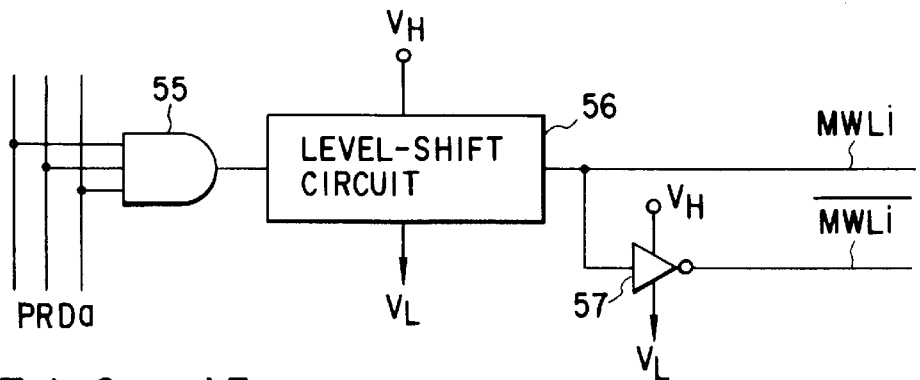
F I G. 15
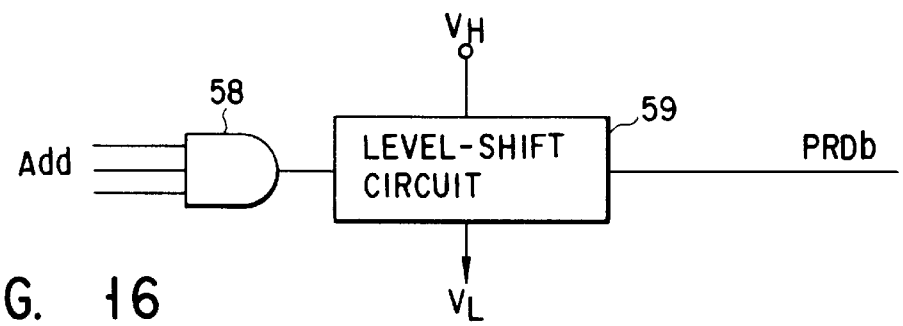
F I G. 16
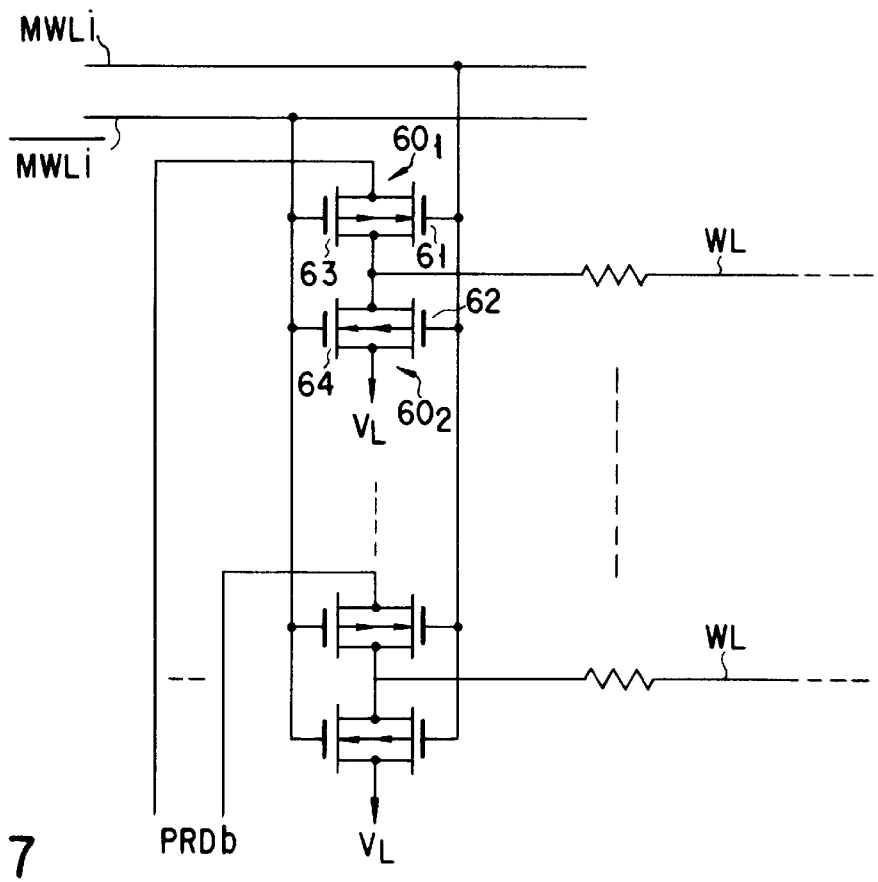
F I G. 17

LEVEL-SHIFT CIRCUIT FOR DRIVING WORD LINES OF NEGATIVE GATE ERASABLE TYPE FLASH MEMORY

BACKGROUND OF THE INVENTION

1. Field of the Invention

This invention relates to a level-shift circuit used in a CMOS circuit, and more particularly to a level-shift circuit suitable for driving word lines in a negative gate erasable type flash memory.

2. Description of the Related Art

Conventionally, a level-shift circuit used in a CMOS circuit is constructed as shown in FIGS. 1 and 2. FIG. 1 shows a circuit for shifting the "H" level and FIG. 2 shows a circuit for shifting the "L" level, and in each of the above circuits, the "H" level of an input signal $V_{IN}$ is set at Vcc and the "L" level thereof is set at the ground potential (GND) level. This type of level-shift circuit is described in Jpn. Appln. KOKAI Publication No. 6-215591 (U.S. Application No. 08/179,126), for example.

The level-shift circuit shown in FIG. 1 includes P-channel MOS transistors Q1, Q2, N-channel MOS transistors Q3, Q4 and a CMOS inverter 11. A potential $V_H$ is applied to the sources of the MOS transistors Q1, Q2, and the drain-source paths of the MOS transistors Q3, Q4 are respectively connected between the drains of the MOS transistors Q1, Q2 and the ground node GND. The gate of the MOS transistor Q1 is connected to a common connection node between the MOS transistors Q2 and Q4 and the gate of the MOS transistor Q2 is connected to a common connection node between the MOS transistors Q1 and Q3. An input signal $V_{IN}$ is supplied to the gate of the MOS transistor Q3 and the input signal $V_{IN}$ is supplied to the gate of the MOS transistor Q4 via the inverter 11. An output signal $V_{OUT}$ is output from a connection node between the MOS transistors Q2 and Q4 and an inverted signal $\overline{V_{OUT}}$ of the output signal $V_{OUT}$ is output from a connection node between the MOS transistors Q1 and Q3. In this circuit, the "L" level of the output signals $V_{OUT}$ and $\overline{V_{OUT}}$ is kept at the ground level, but the "H" level thereof is shifted to the potential $V_H$.

The level-shift circuit shown in FIG. 2 includes P-channel MOS transistors Q5, Q6, N-channel MOS transistors Q7, Q8 and a CMOS inverter 12. A power supply node Vcc is connected to the sources of the MOS transistors Q5, Q6, and the drain-source paths of the MOS transistors Q7, Q8 are respectively connected between the drains of the MOS transistors Q5, Q6 and a potential node $V_L$. The gate of the MOS transistor Q7 is connected to a common connection node between the MOS transistors Q6 and Q8 and the gate of the MOS transistor Q8 is connected to a common connection node between the MOS transistors Q5 and Q7. An input signal $V_{IN}$ is supplied to the gate of the MOS transistor Q5 and the input signal $V_{IN}$ is supplied to the gate of the MOS transistor Q6 via the inverter 12. An output signal $V_{OUT}$ is output from a connection node between the MOS transistors Q6 and Q8 and an inverted signal $\overline{V_{OUT}}$ of the output signal $V_{OUT}$ is output from a connection node between the MOS transistors Q5 and Q7. In the circuit of FIG. 2, the "H" level of the output signals $V_{OUT}$ and $\overline{V_{OUT}}$ is kept at Vcc, but the "L" level thereof is shifted to the potential $V_L$.

The P-channel MOS transistors Q1, Q2 in the circuit of FIG. 1 are formed in an N-well region biased by the potential $V_H$, and the N-channel MOS transistors Q7, Q8 in the circuit of FIG. 2 are formed in a P-well region biased by the potential $V_L$.

Next, the row decoder circuit of a flash memory is considered. At the time of data writing in the cell transistor of the flash memory, the source thereof is grounded, and potentials Vg (Vg=Vpr>Vcc) and Vd (Vd>0) are respectively applied to the control gate and drain thereof. By application of the above potentials, hot electrons are injected into the floating gate to effect the writing operation. On the other hand, at the time of erasing, a high positive potential Vs (Vs>0) is applied to the source and a high negative potential Vg (Vg=Ver<0) is applied to the control gate to set up an intense electric field across the tunnel oxide film and extract electrons in the floating gate by the tunnel current (this is called "negative gate erasing"). In the negative gate erasing, since a negative potential is applied to the control gate, the potential applied to the source can be suppressed to a lower potential in comparison with a method of erasing data by applying the ground potential to the control gate (this is called "source erasing").

Further, at the verifying time of the program, the potential of the floating gate is set to a potential higher than Vcc to check the threshold voltage Vth. Since the control gate corresponds to the word line in the memory cell array, it becomes necessary for the row decoder circuit for driving the control gates, that is, word lines to output a potential higher than Vcc to the word line at the time of writing or verifying and output a negative potential to the word line at the time of erasing.

The potentials $V_H$, $V_L$ and the word line potential in the writing mode, erasing mode and verifying mode can be summarized as shown in the following table 1.

TABLE 1

| MODE | POTENTIAL $V_H$ | $V_L$ | WORD LINE |
| --- | --- | --- | --- |
| WRITING | Vpr > Vcc | GND | Vpr/GND |
| ERASING | Vcc | Ver < 0 | Ver/Vcc |
| VERIFYING | Vvr > Vcc | GND | Vvr/GND |

If the level-shift circuits shown in FIGS. 1 and 2 are applied to the above row decoder, a circuit as shown in FIG. 3 is obtained. FIG. 3 shows a circuit portion corresponding to one word line in the row decoder circuit. An address signal Add is supplied to a decoder 20 and a decoder signal SEL output from the decoder 20 is supplied to a latch circuit 21. The latch circuit 21 latches the decoder signal SEL in response to a latch signal $\overline{LAT}$. An output signal of the latch circuit 21 is supplied to the level-shift circuit 22 shown in FIG. 2 in which the "L" level thereof is shifted to the potential $V_L$ and whose output signal is supplied to the level-shift circuit 23 shown in FIG. 1. In the level-shift circuit 23, the "H" level of the output signal of the level-shift circuit 22 is shifted to the potential $V_H$ and then the output signal is supplied to the word line. As a result, the "H" level of the signal supplied to the word line is set to $V_H$ and the "L" level thereof is set to $V_L$. In the circuit of FIG. 3, as the output signals of the level-shift circuits 22, 23, output signals $\overline{V_{OUT}}$ of the level-shift circuits shown in FIGS. 1 and 2 are used.

When the address signal Add is decoded, the decoder signal SEL for the selected word line is set to the "H" level and the decoder signal SEL for the non-selected word line is set to the "L" level. The "H" level of the decoder signal SEL is Vcc and the "L" level thereof is GND. For example, the latch circuit 21 is constructed by a set-reset type flip-flop as shown in FIG. 4, and if the latch signal $\overline{LAT}$ supplied to the reset input terminal is set at the "H" level, the "H" and "L" levels of the input signal $V_{IN}$ are supplied as they are as the output signal $V_{OUT}$. On the other hand, if the latch signal $\overline{LAT}$ is set at the "L" level, the output signal $V_{OUT}$ is held at the "L" level when the input signal $V_{IN}$ supplied to the set input terminal is set at the "L" level, and after this, once the input signal $V_{IN}$ is set to the "H" level, the output signal $V_{OUT}$ inverted and kept at the "H" level.

With the above construction, the latch signal $\overline{LAT}$ of the latch circuit 21 is set to the "H" level and the potential $V_L$ is set at the GND level at the time of writing. Decoding of the address signal Add is effected with $V_H$=Vcc, and after determination, the potential $V_H$ is changed from the Vcc level to the Vpp level. As a result, the potential of only the word line selected by the address signal Add is set to the Vpr level and the potential of the other word lines (non-selected word lines) is set to the GND level.

On the other hand, at the time of erasing, the potential $V_H$ is set to the Vcc level. Further, the potential $V_L$ is set to the GND level so as to set all of the addresses into the non-selected state, that is, set the decoder signals SEL for all of the word lines to the "L" level, and in this state, the latch signal $\overline{LAT}$ is changed from the "H" level to the "L" level. As a result, first, all of the word lines are latched in the non-selected state. Next, if address selection is sequentially effected only for those of the word lines which are not desired to be subjected to the erasing process, only the decoder signals SEL for these word lines are set to the "H" level and latched data is inverted to set a selected state. In this state, if the potential $V_L$ is changed from the GND level to the negative potential Ver, the potentials of only those of the word lines which are latched in the non-selected state are set to the negative potential Ver to effect the erasing operation (the relation between the selected state and non-selected state is opposite to that for the word line to be subjected to the erasing process). The word line set in the selected state is kept at the Vcc level and is not subjected to the erasing process.

Thus, desired operations can be effected in the respective modes requiring the level-shift.

Next, the readout operation is considered. At the time of data readout, since the potential of the word line is normally set at the Vcc level, the address signal Add is decoded with the latch signal $\overline{LAT}$ set at the "H" level, the potential $V_L$ set at the GND level and the potential $V_H$ set at the Vcc level. At this time, the latch circuit 21 and level-shift circuits 22 and 23 transfer the input signal as it is and the decoding operation is delayed by time corresponding to the gate delay.

Now, the construction of the above decoder circuit is compared with that of a source erasable flash memory. In the source erasable type circuit, only the source is set to a high potential with the control gate of the cell transistor kept at the GND level at the time of erasing. Therefore, it is not necessary to bias the word line to a negative potential, and there occurs no difference between the selected and non-selected word lines, and the latch circuit 21 and level-shift circuit 22 become unnecessary. As a result, the access time in the negative gate erasable type row decoder circuit is deteriorated by insertion of the latch circuit 21 and level-shift circuit 22. Particularly, as shown in FIGS. 1 and 2, since the conventional level-shift circuit has a feedback type circuit construction and the ratio of the areas of the P-channel MOS transistor and the N-channel MOS transistor is unbalanced to forcedly effect the inverting operation, the gate delay becomes larger in comparison with a normal inverter or the like. Further, a case wherein transistors of a Vcc circuit system and transistors of a circuit operated on high voltages at the time of writing and erasing are separately formed, the gate oxide film of the former transistor is made thin to set the threshold voltage Vth thereof low, and the gate oxide film of the latter transistor is made thick to set the threshold voltage Vth thereof high in order to cope with a lowering in the power supply voltage (for example, a lowering from 5 V to 3.3 V) is considered. The above construction is made because the performance becomes extremely low if the transistor whose gate oxide film is made thick to set the threshold voltage Vth high in order to cope with the high-voltage operation is operated by the power supply voltage Vcc which is lowered. However, with the construction shown in FIG. 3, it becomes necessary to operate the high-voltage transistor by the voltage Vcc at the time of readout, thereby further delaying the operation.

SUMMARY OF THE INVENTION

Accordingly, a first object of this invention is to provide a level-shift circuit capable of suppressing the gate delay and enhancing the operation speed.

A second object of this invention is to provide a level-shift circuit capable of reducing access time when it is applied to the row decoder circuit of a negative gate erasable flash memory.

Further, a third object of this invention is to provide a level-shift circuit which can effect the level-shift of "H" and "L" levels in one stage, latch an input signal and cope with a lowering in the power supply voltage without lowering the operation speed and which is suitable for the row decoder circuit of a negative gate erasable flash memory.

A fourth object of this invention is to provide a semiconductor memory device having a level-shift circuit capable of suppressing the gate delay and enhancing the operation speed.

A fifth object of this invention is to provide a negative gate erasable flash memory having a level-shift circuit capable of reducing access time in the row decoder circuit thereof.

Further, a sixth object of this invention is to provide a negative gate erasable type flash memory including a row decoder circuit having a level-shift circuit which can effect the level-shift of "H" and "L" levels in one stage, latch an input signal and cope with a lowering in the power supply voltage without lowering the operation speed.

The above first to third objects can be attained by a level-shift circuit comprising a first inverting circuit operated with a voltage between a potential of a first potential supplying source and a potential of a second potential supplying source used as a power supply voltage; a second inverting circuit having an input terminal connected to an output of the first inverting circuit and an output terminal connected to an input terminal of the first inverting circuit and operated with a voltage between the potential of the first potential supplying source and the potential of the second potential supplying source used as a power supply voltage; first and second transistors of a first conductivity type whose current paths are serially connected between the input terminal of the first inverting circuit and a third potential supplying source, the gate of the second transistor being supplied with an input signal whose high level is set at a potential of a fourth potential supplying source and whose low level is set at a potential of the third potential supplying source; third and fourth transistors of the first conductivity type whose current paths are serially connected between the input terminal of the second inverting circuit and the third potential supplying source; a control circuit for shifting a low level of a first control signal to the potential of the second potential supplying source and supplying the level-shifted first control signal to the gates of the first and third transistors to control the conduction states thereof; and a logic circuit for supplying a logical signal to the gate of the fourth transistor in response to the input signal to control the conduction state thereof; wherein an output signal is derived from at least one of the output terminals of the first and second inverting circuits.

With the above construction, the first and second inverting circuits constitute a latch circuit and the latching operation of the latch circuit is controlled according to the level of the control signal. When the control signal is at the high level, data corresponding to the input signal and an inverted signal thereof is latched, and when the control signal is at the low level, latched data is held. The first and second inverting circuits are operated with a voltage between the first and second potential supplying sources used as a power supply voltage and an output signal whose levels are shifted to the potentials of the first and second potential supplying sources is derived from at least one of the output terminals of the first and second inverting circuits.

According to the level-shift circuit with the above construction, since the feedback type circuit construction is not used and the inverter circuit construction is used, the gate delay is suppressed and the operation speed can be enhanced. Further, since the level-shift of both of the "H" and "L" levels can be effected in one stage, the access time can be reduced when the level-shift circuit is applied to the row decoder circuit of a negative gate erasable type flash memory. Further, since the level-shift of the "H" and "L" levels can be effected in one stage and the operation of latching an input signal can be effected, it can cope with a lowering in the power supply voltage without lowering the operation speed and can be suitably used for the row decoder circuit of the negative gate erasable type flash memory.

The above fourth to sixth objects can be attained by a semiconductor memory device comprising an address buffer to which an address signal is input; an address latch circuit supplied with an output signal of the address buffer; an address counter for counting an input of the address signal; an address multiplexer supplied with output signals from the address buffer, address latch circuit and address counter, for selecting one of the output signals and outputting the selected output signal to an address bus; a redundancy ROM for storing a defective address or addresses; a comparator for comparing an address signal output to the address bus with the defective address stored in the redundancy ROM and outputting a coincidence signal when the compared addresses are coincident with each other; a row pre-decoder for decoding an address signal output to the address bus, the row pre-decoder being de-activated at the time of erasing and when the coincidence signal is output from the comparator; a main decoder supplied with a row pre-decoder signal output from the row pre-decoder and having a main decoder circuit for decoding a row pre-decoder signal output from the row pre-decoder and a first level-shift circuit for shifting the level of a main decoder signal output from the main decoder circuit to select the row of the memory cell array; and a second level-shift circuit for shifting the level of the coincidence signal to select a spare memory cell when the coincidence signal is output from the comparator; wherein the first level-shift circuit includes a first inverting circuit operated with a voltage between a potential of a first potential supplying source and a potential of a second potential supplying source used as a power supply voltage; a second inverting circuit having an input terminal connected to an output of the first inverting circuit and an output terminal connected to an input terminal of the first inverting circuit and operated with a voltage between the potential of the first potential supplying source and the potential of the second potential supplying source used as a power supply voltage; first and second transistors of a first conductivity type whose current paths are serially connected between the input terminal of the first inverting circuit and a third potential supplying source, the gate of the second transistor being supplied with an input signal whose high level is set at a potential of a fourth potential supplying source and whose low level is set at a potential of the third potential supplying source; third and fourth transistors of the first conductivity type whose current paths are serially connected between the input terminal of the second inverting circuit and the third potential supplying source; a control circuit for shifting a low level of an erasing signal to the potential of the second potential supplying source and supplying the level-shifted erasing signal to the gates of the first and third transistors to control the conduction states thereof; and a logic circuit for supplying a logical signal to the gate of the fourth transistor in response to the main decoder signal to control the conduction state thereof; the row of the memory cell array is selected according to an output signal of the second inverting circuit; the second level-shift circuit includes a third inverting circuit operated with a voltage between the potential of the first potential supplying source and the potential of the second potential supplying source used as a power supply voltage; a fourth inverting circuit having an input terminal connected to an output of the third inverting circuit and an output terminal connected to an input terminal of the third inverting circuit and operated with a voltage between the potential of the first potential supplying source and the potential of the second potential supplying source used as a power supply voltage; fifth and sixth transistors of the first conductivity type whose current paths are serially connected between the input terminal of the third inverting circuit and the third potential supplying source, the gate of the fifth transistor being supplied with the coincidence signal whose high level is set at the potential of the fourth potential supplying source and whose low level is set at the potential of the third potential supplying source; seventh and eighth transistors of the first conductivity type whose current paths are serially connected between the input terminal of the fourth inverting circuit and the third potential supplying source; a second control circuit for shifting the low level of the erasing signal to the potential of the second potential supplying source and supplying the level-converted erasing signal to the gates of the fifth and seventh transistors to control the conduction states thereof; and a second logic circuit for supplying a logical signal to the gate of the fourth transistor in response to the coincidence signal to control the conduction state thereof; and the spare memory cell is selected according to an output signal of the fourth inverting circuit.

According to the semiconductor memory device with the above construction, since a level-shift circuit having not the feedback type circuit construction but the inverter circuit construction is used, the gate delay is suppressed and the operation speed can be enhanced. Further, since the level-shift of both of the "H" and "L" levels can be effected by use of one level-shift circuit, one level-shift circuit can be used instead of two level-shift circuits and a latch circuit required in the conventional row decoder circuit of the negative gate erasable type flash memory and the access time can be reduced. Further, it is possible to provide a negative gate erasable type flash memory having a level-shift circuit which is provided in the row decoder circuit and in which the level-shift of both of the "H" and "L" levels can be effected in one stage, the operation of latching an input signal can be effected and which can cope with a lowering in the power supply voltage without lowering the operation speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10B is a circuit diagram showing an example of the construction of a potential detection circuit;

FIG. 15 is a circuit diagram showing an example of the construction of a main decoder portion in the circuit shown in FIG. 14;

FIG. 16 is a circuit diagram showing an example of the construction of a pre-decoder portion in the circuit shown in FIG. 14; and FIG. 17 is a circuit diagram showing an example of the construction of a sub-decoder portion in the circuit shown in FIG. 14.

DETAILED DESCRIPTION OF THE PREFERRED EMBODIMENTS

Figure 5:
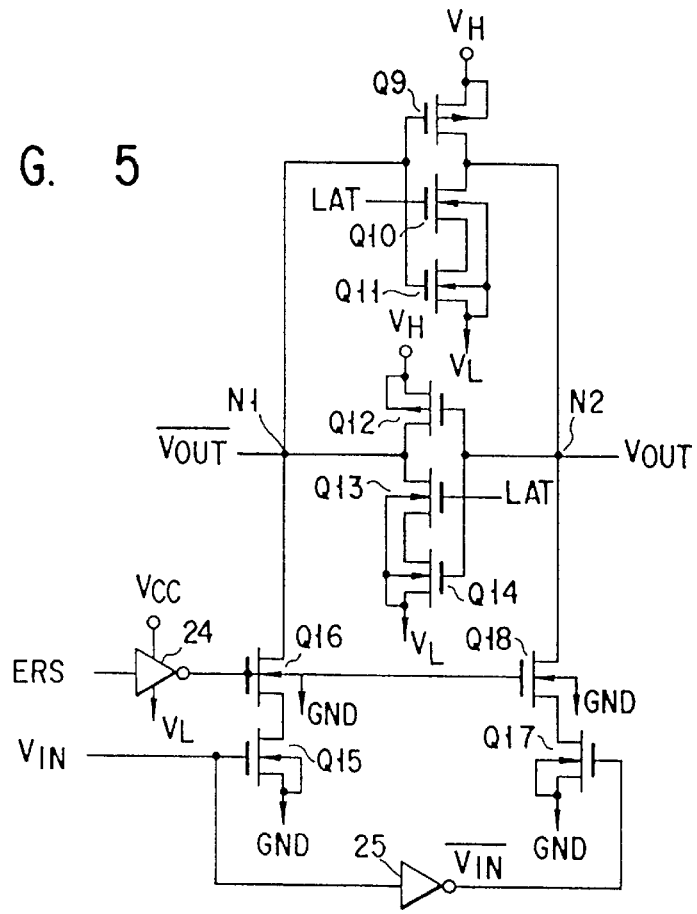
FIG. 5 is a circuit diagram showing a level-shift circuit according to a first embodiment of this invention.

FIG. 5 shows the construction of a level-shift circuit (level conversion circuit) according to a first embodiment of this invention. The level-shift circuit includes P-channel MOS transistors Q9, Q12, N-channel MOS transistors Q10, Q11, Q13 to Q18, a CMOS inverter 24 operated on a power supply potential Vcc and a potential $V_L$ and a CMOS inverter 25. The current paths of the MOS transistors Q9 to Q11 are serially connected between the potentials $V_H$ and $V_L$, and the current paths of the MOS transistors Q12 to Q14 are serially connected between the potentials $V_H$ and $V_L$. The gates of the MOS transistors Q9, Q11 are connected to a connection node between the MOS transistors Q12 and Q13, and the gates of the MOS transistors Q12, Q14 are connected to a connection node between the MOS transistors Q9 and Q10. A latch signal LAT is supplied to the gates of the MOS transistors Q10, Q13 to control the ON/OFF states thereof. Further, the backgates of the MOS transistors Q9, Q12 are connected to the potential $V_H$, and the backgates of the MOS transistors Q10, Q11, Q13, Q14 are connected to the potential $V_L$. That is, the MOS transistors Q9, Q12 are formed in an N-well region biased by the potential $V_H$, and the MOS transistors Q10, Q11, Q13, Q14 are formed in an P-well region biased by the potential $V_H$.

The current paths of the MOS transistors Q16, Q15 are serially connected between the connection node of the MOS transistors Q12 and Q13 and the ground node GND, and the current paths of the MOS transistors Q18, Q17 are serially connected between the connection node of the MOS transistors Q9 and Q10 and the ground node GND. An input signal $\overline{V_{IN}}$ is supplied to the gate of the MOS transistor Q15, and an input signal $V_{IN}$ inverted by the CMOS inverter 25 operated on a voltage between the power supply potential Vcc and the ground potential GND is supplied to the gate of the MOS transistor Q17. Further, an erasing signal ERS is supplied to the gates of the MOS transistors Q16, Q18 via the CMOS inverter 24 operated on a voltage between the power supply potential Vcc and the potential $V_L$. The backgates of the MOS transistors Q15 to Q18 are connected to the ground node GND. An output signal $V_{OUT}$ is derived from the connection node between the MOS transistors Q9 and Q10, and an inverted signal $\overline{V_{OUT}}$ of the output signal $V_{OUT}$ is derived from the connection node between the MOS transistors Q12 and Q13.

Figure 6:
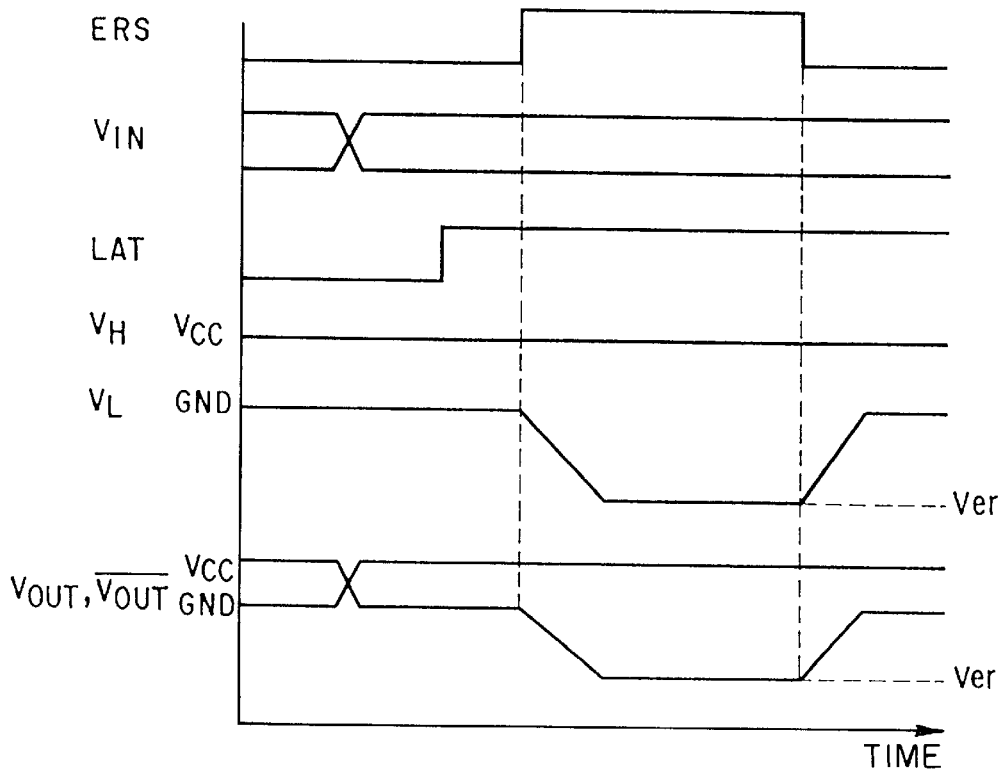
FIG. 6 is a timing chart for illustrating the operation of the circuit shown in FIG. 5.

Next, the operations in the respective modes with the above construction are explained with reference to the timing chart shown in FIG. 6. At the writing time, the latch signal LAT is set to the "L" level, the potential $V_L$ is set to the ground potential GND, and the erasing signal ERS is set to the "L" level. At the address decoding time, the potential $V_H$ is first set at the Vcc level, but after determination, the potential $V_H$ is changed from the Vcc level to the high potential Vpr. Since the MOS transistors Q10, Q13 are set in the non-conductive state by the "L" level of the latch signal LAT, this state is equivalent to a state in which the MOS transistors Q10, Q11, Q13 and Q14 are disconnected from the potential $V_L$ from the DC standpoint. Further, from the AC standpoint, the gate capacitance of the MOS transistor Q11 and the drain capacitance of the MOS transistor Q13 are associated with the node N1 and the gate capacitance of the MOS transistor Q14 and the drain capacitance of the MOS transistor Q10 are associated with the node N2, but the influence by AC can be suppressed to minimum by making the size of the MOS transistors Q10, Q11, Q13, Q14 sufficiently smaller than the size of the MOS transistors Q15 to Q18.

Figure 1:
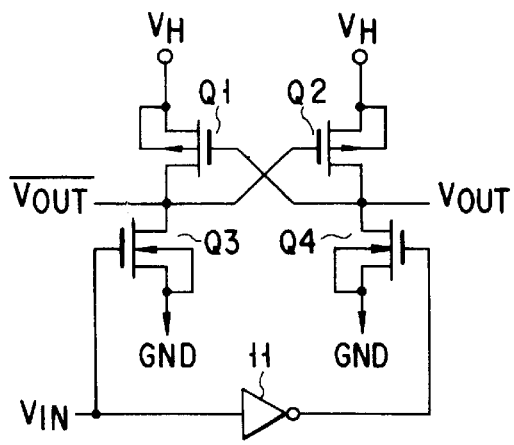
FIG. 1 is a circuit diagram showing the conventional level-shift circuit for effecting the level-shift of "H" level.
Figure 2:
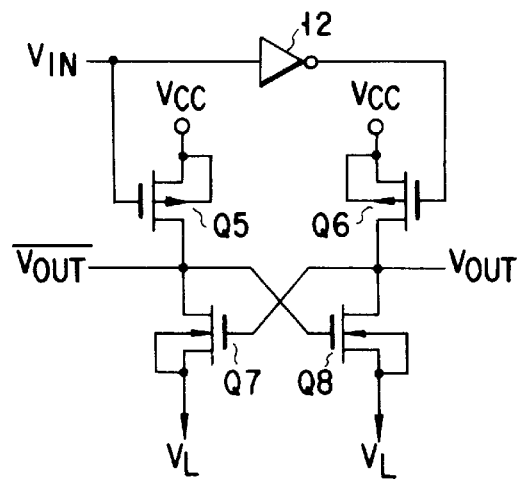
FIG. 2 is a circuit diagram showing the conventional level-shift circuit for effecting the level-shift of "L" level.
Figure 3:
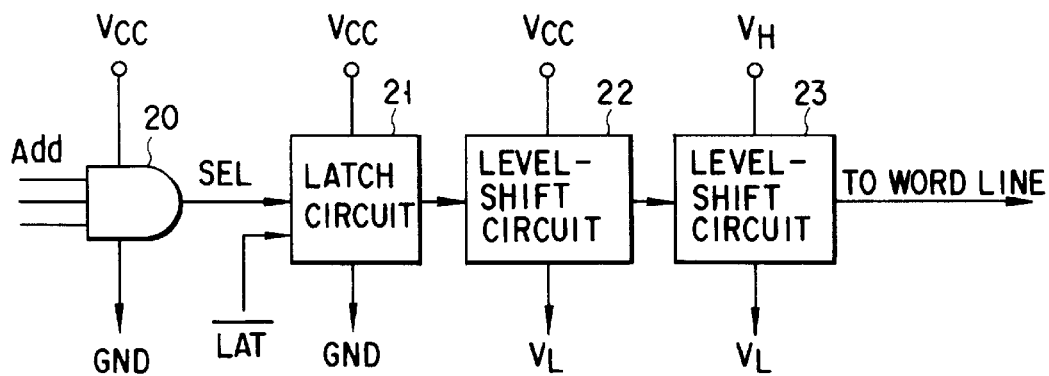
FIG. 3 is a circuit diagram showing the construction obtained when the level-shift circuits shown in FIGS. 1 and 2 are applied to the row decoder circuit of a negative gate erasable flash memory with much attention given to one word line.
Figure 4:
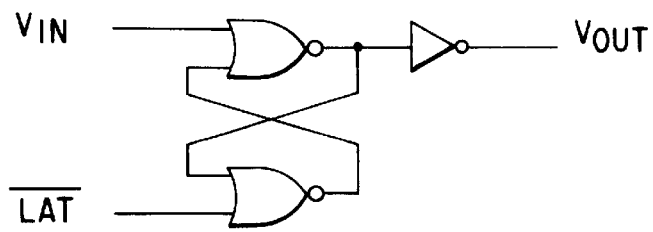
FIG. 4 is a circuit diagram showing an example of the construction of a latch circuit in the circuit of FIG. 3.

Further, since the gate potentials of the MOS transistors Q16, Q18 are set to the Vcc level and the MOS transistors are set in the conductive state, the sources of the MOS transistors Q16, Q18 can be regarded as being grounded by making the size of the MOS transistors Q16, Q18 sufficiently larger than the size of the MOS transistors Q15, Q17. Therefore, the circuit shown in FIG. 5 becomes substantially equal to the level-shift circuit shown in FIG. 1 at the time of writing and the gate delay caused when $V_H$ is set at Vcc can be regarded substantially equal.

At the verifying time, the operation is similar to that effected at the writing time. Therefore, the level-shift to the "H" level side in the circuit of FIG. 5 is effected in substantially the same manner as in the circuit of FIG. 1.

At the erasing time, the erasing signal ERS is first set to the "L" level, the potential $V_L$ is set to the GND level, the potential $V_H$ is set to the Vcc level and the latch signal LAT is set to the "L" level so as to determine the input signal $V_{IN}$. At this time, the output signals $V_{OUT}$, $\overline{V_{OUT}}$ are respectively set to the Vcc level and GND level when the input signal $V_{IN}$ is at the "H" level, and respectively set to the GND level (=$V_L$) and Vcc level when the input signal $V_{IN}$ is at the "L" level. At this time, if the latch signal LAT is set to the "H" level, the MOS transistors Q9 to Q11 and the MOS transistors Q12 to Q14 effect the inverting operations so as to cause the above-described states to be latched in the above two latches. Next, the erasing signal ERS is set to the "H" level. The gate potential of the MOS transistors Q16, Q18 is set to the potential $V_L$ (=GND level) and the MOS transistors Q16, Q18 are set in the non-conductive state. As a result, the levels of the input signals $V_{IN}$ and $\overline{V_{IN}}$ are not reflected, but since the previous state is latched, the levels of the output signals $V_{OUT}$ and $\overline{V_{OUT}}$ are held. The potential $V_L$ is lowered to a negative potential by a charge pump circuit at the same time that the erasing signal ERS is set to the "H" level. Since the node on the "L" level side of the output signal $V_{OUT}$ or $\overline{V_{OUT}}$ is set at the potential $V_L$, the node is also set to a negative potential. At this time, since the gate potentials of the MOS transistors Q15, Q17 are set to the Vcc level or GND level, the MOS transistor on the "L" level side is turned ON, but the gate potential of the MOS transistors Q16, Q18 is set at the potential $V_L$ and the MOS transistors Q16, Q18 are set in the OFF state without fail, thereby interrupting the current path to the ground node GND. Therefore, the level-shift to the negative potential can be attained. Even if the size of the MOS transistors Q10, Q11, Q13, Q14 is made smaller than the size of the MOS transistors Q15, Q17, the latch function can be attained without causing any problem.

As described above, the level-shift circuit shown in FIG. 5 can effect the level-shift (level conversion) on the "H" level side and on the "L" level side in one stage of the level-shift circuit.

Figure 7:
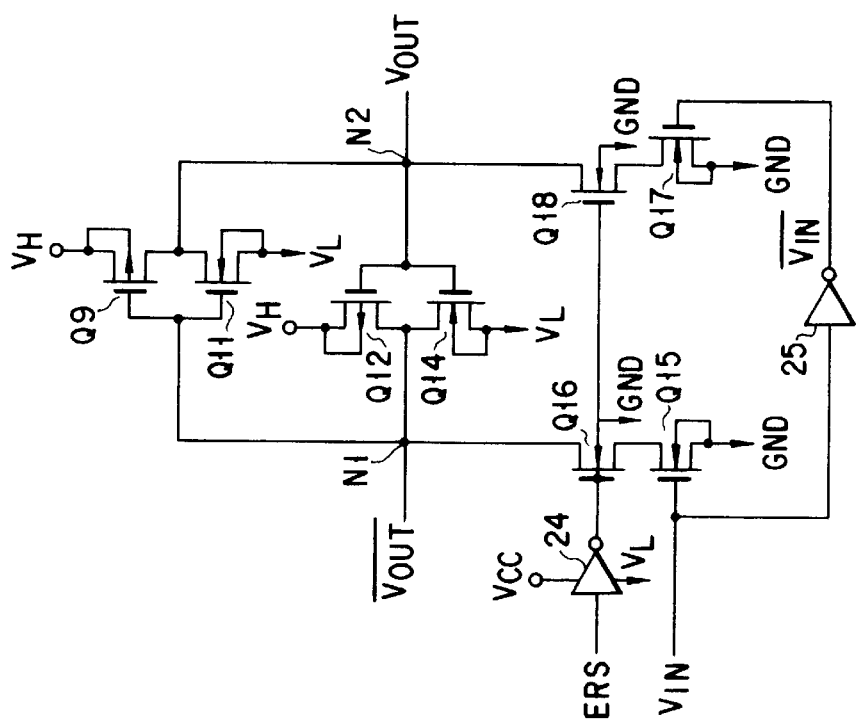
FIG. 7 is a circuit diagram showing a level-shift circuit according to a second embodiment of this invention.

FIG. 7 shows a level-shift circuit according to a second embodiment of this invention and obtained by omitting the MOS transistors Q10, Q13 in the circuit of FIG. 5. In FIG. 7, portions which are the same as corresponding portions of FIG. 5 are denoted by the same reference numerals and the explanation therefor is omitted. The circuit of FIG. 7 corresponds to the circuit of FIG. 5 in which the latch signal LAT is always kept at the "H" level. However, since the size of the MOS transistors Q15, Q17 can be made sufficiently larger than the size of the MOS transistors Q9, Q10, Q12, Q13, the gate delay will be slightly increased in comparison with the circuit of FIG. 5, but the level-shift function is not influenced at all and the level-shift operation shown by the timing chart of FIG. 6 can be attained.

Figure 8:
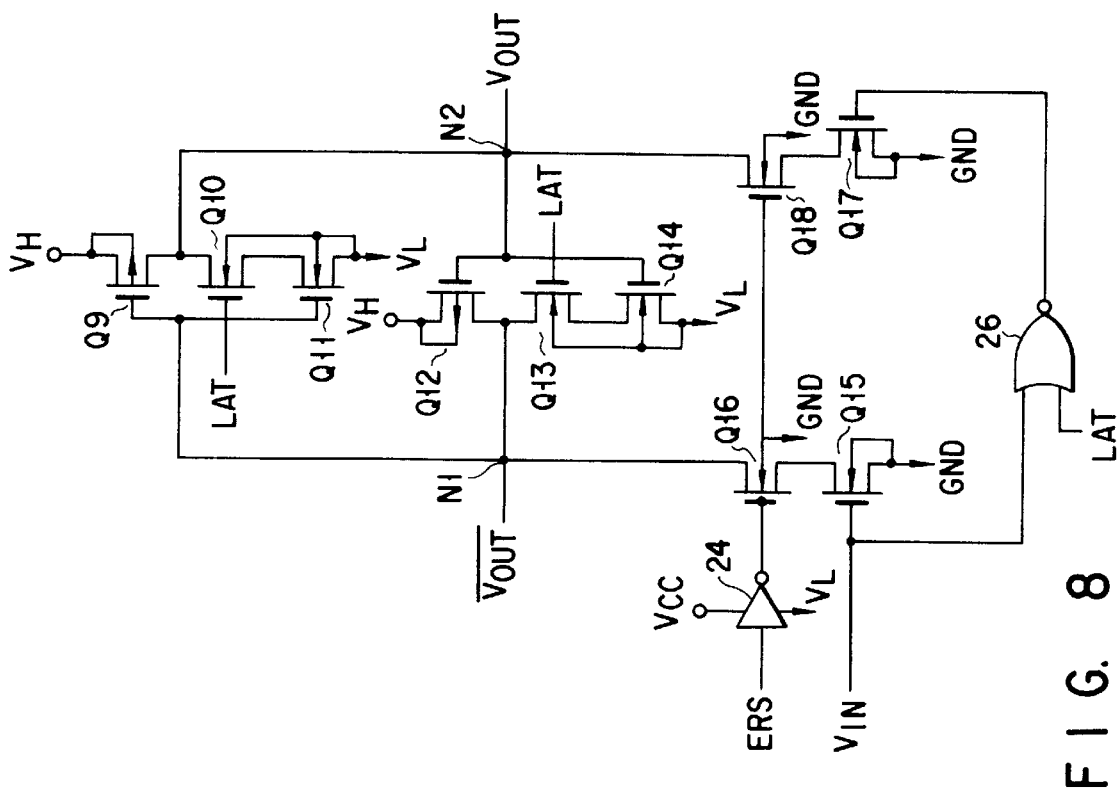
FIG. 8 is a circuit diagram showing a level-shift circuit according to a third embodiment of this invention.

Next, the R/S type latch function is considered. As is described in the "Description of the Related Art", in the row decoder circuit of a flash memory in which the negative gate erasing is effected, it is necessary to keep the word line which is not desired to be subjected to the erasing process in the selected state and keep the word line from being set to the negative potential. In order to meet the requirement, as shown in FIG. 8, a 2-input NOR gate 26 may be used instead of the inverter 25 in the circuit of FIG. 5. That is, an input signal $V_{IN}$ is supplied to one input terminal of the NOR gate 26 and a latch signal LAT is supplied to the other input terminal thereof. Further, an output signal of the NOR gate 26 is supplied to the gate of the MOS transistor Q17.

With the above construction, the latch signal LAT is set to the "H" level in a state in which the input signal $V_{IN}$ is set at the "L" level in the process of latching the output signals $V_{OUT}$, $\overline{V_{OUT}}$ at the time of erasing. As a result, the output signal $V_{OUT}$ is latched in the "L" level, that is, in the non-selected state, and an output of the NOR gate 26 is fixed at the "L" level. In a case where it is not desired to be subjected to the erasing process, if an address is selected so as to set the input signal $V_{IN}$ to the "H" level, the MOS transistor Q15 is turned ON and the output signals $V_{OUT}$ and $\overline{V_{OUT}}$ are respectively set to the GND level and Vcc level and thus inverted into the selected state. After this, even if the input signal $V_{IN}$ is set back to the "L" level, the output signals $\overline{V_{OUT}}$, $V_{OUT}$ will not be set back to the selected state since the output signal $\overline{V_{IN}}$ of the NOR gate 25 is fixed at the "L" level. Thus, selective application of negative potential like the conventional case can be attained.

Figure 9:
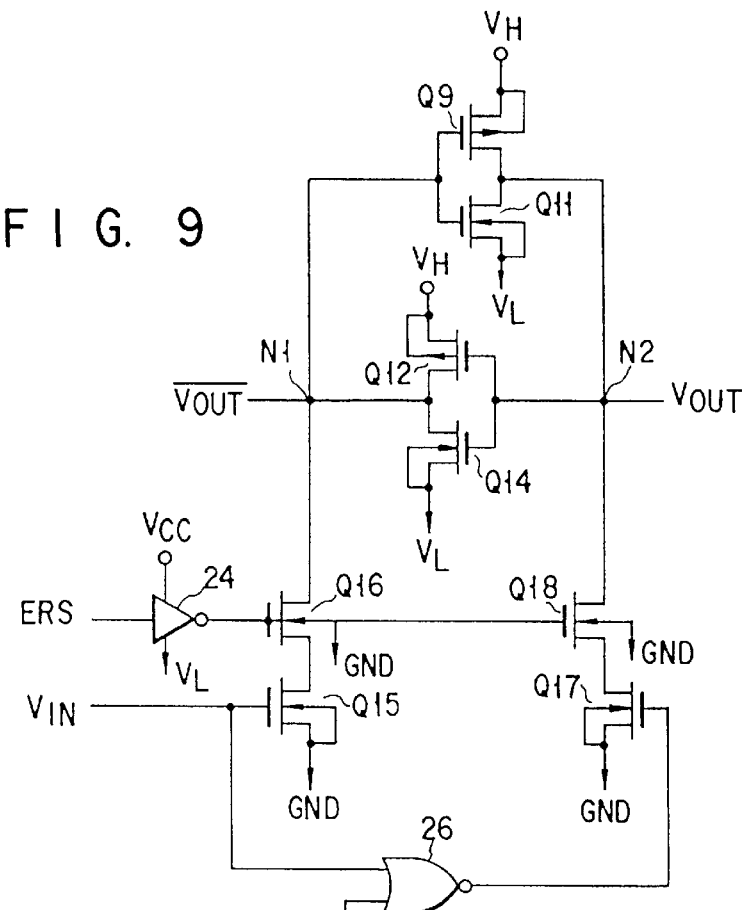
FIG. 9 is a circuit diagram showing a level-shift circuit according to a fourth embodiment of this invention.

As shown in FIG. 9, it is, of course, possible to provide a NOR gate 26 instead of the inverter 25 in the circuit of FIG. 7.

Figure 10A:
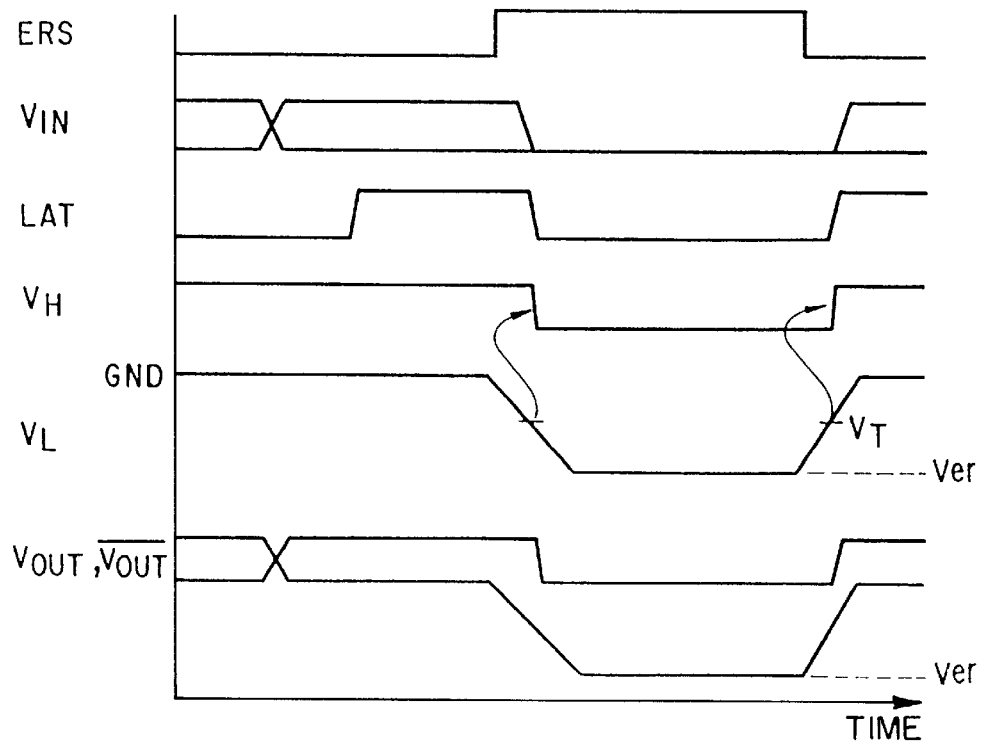
FIG. 10A is a timing chart for illustrating the operation of lowering the gate potential to solve the problem caused by the withstand voltage of the gate oxide film and the drain withstand voltage in the level-shift circuit in the first to fourth embodiments of this invention.

In the circuits of the above first to fourth embodiments, the MOS transistors Q9 to Q14 are operated on the gate potential of |Vcc|+|Ver|, but in a case where the drain withstand voltage and the withstand voltage of the gate oxide film are considered to cause a problem, the gate potential can be lowered to |Ver| by lowering the potential $V_H$, latch signal LAT, input signal $V_{IN}$ and the power supply voltage Vcc of the inverter 24 (or NOR gate 26) to the ground potential GND while the $V_L$ level is set lower than a preset potential $V_T$ which is lower than Vcc as shown in the timing chart of FIG. 10A. At this time, since the potential difference between the ground potential GND and the potential Ver is higher than Vcc, the latch operation is not influenced. Further, since the potential level of a word line which is not desired to be subjected to the erasing process is not set to the power supply potential Vcc but set to the ground potential GND, it becomes highly resistant to various disturbances.

FIG. 10B shows an example of the construction of a potential detection circuit for determining whether the potential $V_L$ is higher or lower than the potential $V_T$ and detecting the switching timing for lowering the potential $V_H$ to the ground potential GND. The potential detection circuit includes a generator 100 for generating the potential $V_L$, The table 2 indicates the relation between the various potentials in the respective operation modes.

TABLE 2

| MODE | POTENTIAL | | | | | | | |
|---|---|---|---|---|---|---|---|---|
| | $V_H$ (FIRST NODE) | $V_L$ (SECOND NODE) | GND (THIRD NODE) | Vcc | $V_{IN}$ | LAT | ERS | $V_{OUT}$ $\overline{V_{OUT}}$ |
| ERASING | | | | | | | | |
| 1 | Vcc (>0) ↓ ↓ | Ver (GND) ↓ ↓ | GND ↓ ↓ | Vcc ↓ ↓ | 1 (Vcc) 0 (GND) | H ↓ ↓ | L ↓ ↓ | $V_H$ $V_L$ $V_L$ $V_H$ |
| 2 | Vcc (>0) ↓ ↓ | Ver (0 > Ver > $V_T$) ↓ ↓ | ↓ ↓ ↓ | ↓ ↓ ↓ | ↓ ↓ ↓ | ↓ ↓ ↓ | H ↓ ↓ | $V_H$ or $V_L$   $V_L$ or $V_H$ |
| 3 | GND ↓ ↓ | Ver (0 > $V_T$ ≧ Ver) ↓ ↓ | ↓ ↓ ↓ | ↓ ↓ ↓ | ↓ ↓ ↓ | L ↓ ↓ | ↓ ↓ ↓ | ↓ ↓ |
| WRITING | Vpr (Vpr > Vcc) ↓ ↓ | GND ↓ ↓ | ↓ ↓ ↓ | ↓ ↓ ↓ | 1 (Vcc) 0 (GND) | ↓ ↓ ↓ | L ↓ ↓ | $V_H$ $V_L$ $V_L$ $V_H$ |
| VERTIFYING | Vvr (Vvr > Vcc) ↓ ↓ | GND ↓ ↓ | ↓ ↓ ↓ | ↓ ↓ ↓ | 1 (Vcc) 0 (GND) | ↓ ↓ ↓ | ↓ ↓ ↓ | $V_H$ $V_L$ $V_L$ $V_H$ |
| READING | Vcc (>0) ↓ ↓ | GND ↓ ↓ | ↓ ↓ ↓ | ↓ ↓ ↓ | 1 (Vcc) 0 (GND) | ↓ ↓ ↓ | ↓ ↓ ↓ | $V_H$ $V_L$ $V_L$ $V_H$ | resistors R1, R2, comparator 110, inverter 120, level shift circuit 130 and inverter 140. The generator 100 outputs a potential $V_L$ ranging from the ground GND level to the potential Ver. The resistors R1, R2 divide the potential difference between a positive reference potential (for example, power supply potential Vcc) and the output potential $V_L$ of the generator 100. The connection node between the resistors R1 and R2 is connected to an inverting input terminal (−) of the comparator 110. A non-inverting input terminal (+) of the comparator 110 is applied with a constant potential used as a reference (for example, it is grounded). The comparator 110 outputs a switching signal which is set to an "H" level or "L" level when the potential at the connection node between the resistors R1 and R2 is higher or lower than the potential $V_T$, respectively. The switching signal is supplied to the level shift circuit 130. The level shift circuit 130 converts a signal of "H" level (Vcc level) output from a circuit of Vcc power supply system for the generator 100, comparator 110, inverter 120 and the like to a potential of $V_H'$ level ($V_H'$ is a constant potential higher than Vcc). The level shift circuit 130 is operated with the potential $V_H'$ and ground potential GND used as a power supply to shift the "H" level (Vcc level) of the switching signal to $V_H'$ and then output the same. At this time, the switching signal is output without shifting the "L" level (GND level). The switching signal subjected to the level-shifting by the level shift circuit 130 is supplied to the inverter 140. The inverter 140 is operated with the potential $V_H'$ and ground potential GND used as a power supply to invert an output signal of the level shift circuit 130 and set the output signal to the $V_H$ level or GND level, respectively, when the potential $V_L$ (erase potential Ver) is higher or lower than the potential $V_T$. The potential is supplied to the sources of the MOS transistors Q9 and Q12 in the level shift circuit shown in FIGS. 5, 6 to 9.

Next, the operations in the respective modes are explained in detail by taking the circuit of FIG. 5 as an example. The erasing mode is executed in three steps. The first step is to write input data into a latch circuit constructed by a first inverting circuit formed of MOS transistors Q9 to Q11 and a second inverting circuit formed of MOS transistors Q12 to Q14. That is, when an input signal $V_{IN}$ is input, one of the MOS transistors Q15 and Q17 is turned ON and the other is turned OFF in response to the input signal. At this time, since the erasing signal ERS is set at the "L" level, an output of the inverter 24 is set to the "H" level so as to set the MOS transistors Q16 and Q18 in the ON state. As a result, the potential level of one of the nodes N1 and N2 is lowered to the ground potential GND. For example, data 1 is input as an input signal $V_{IN}$ to the level shift circuit connected to the word line used for the erasing operation. Data 0 is input as an input signal $V_{IN}$ to the level shift circuit connected to the word line which is not used for the erasing operation. When a latch signal LAT is set to the "H" level, the MOS transistors Q10 and Q13 are turned ON and the two inverter circuits effect the inverting operation to amplify and latch the potential difference between the nodes N1 and N2. At this time, the potential $V_H$ is positive and is set at the Vcc level, for example, and the potential $V_L$ is set at the potential Ver (GND level).

When the erasing signal ERS is raised to the "H" level, the MOS transistors Q16, Q18 are turned OFF to start the second step. In the second step, the potential $V_L$ is lowered to a negative potential (0>Ver>$V_T$).

If the potential detection circuit shown in FIG. 10B detects that the potential $V_L$ becomes lower than the potential $V_T$, the third step is started and the potential $V_H$ is lowered to the ground potential GND. The erasing potential Ver (0>VT≧Ver) is applied to the potential $V_L$ to effect the erasing operation. As a result, the potential difference between the potential $V_H$ and the potential $V_L$ is reduced so as to alleviate the stress applied to the MOS transistors Q9 Q14.

After the erasing operation is completed, the potential $V_L$ is raised from Ver ($\leq V_T$) to the ground potential GND in the order opposite to the order of the above steps and the erasing mode is terminated.

The levels of the potentials $V_H$, $V_L$ in the write mode, verify mode, and readout mode are the same as those in the table 1. In the above modes, both of the latch signal LAT and erasing signal ERS are set to the "L" level. As a result, the MOS transistors Q10, Q13 are turned OFF and MOS transistors Q16, Q18 are turned ON. In this state, the circuit of FIG. 5 effects substantially the same operation as the circuit of FIG. 1.

The operation of the respective modes are explained by taking the circuit of FIG. 5 as an example, but substantially the same operation can be attained in the circuit of FIGS. 7 to 9. However, in the circuit of FIG. 7, control of the latch operation by used of the latch signal LAT is not effected.

As described above, since the "H" level-shift, "L" level-shift and the latch function for selection of the presence or absence of the "L" level-shift can be attained in one stage of level-shift circuit, the decoding operation for negative gate erasing can be realized at substantially the same speed as the decoding operation for source erasing. Further, since the level-shift on the "L" level side is effected by use of a latch, the "H" level side potential can be set to the GND level at the time of application of a negative potential so that the operating potential can be lowered. Further, the potential level of the word line to which the negative bias is not applied can be set to the ground potential GND, and the disturbance caused by biasing of the source and gate and application of the stress on the defective word line relieved by the redundancy can be avoided.

Figure 11:
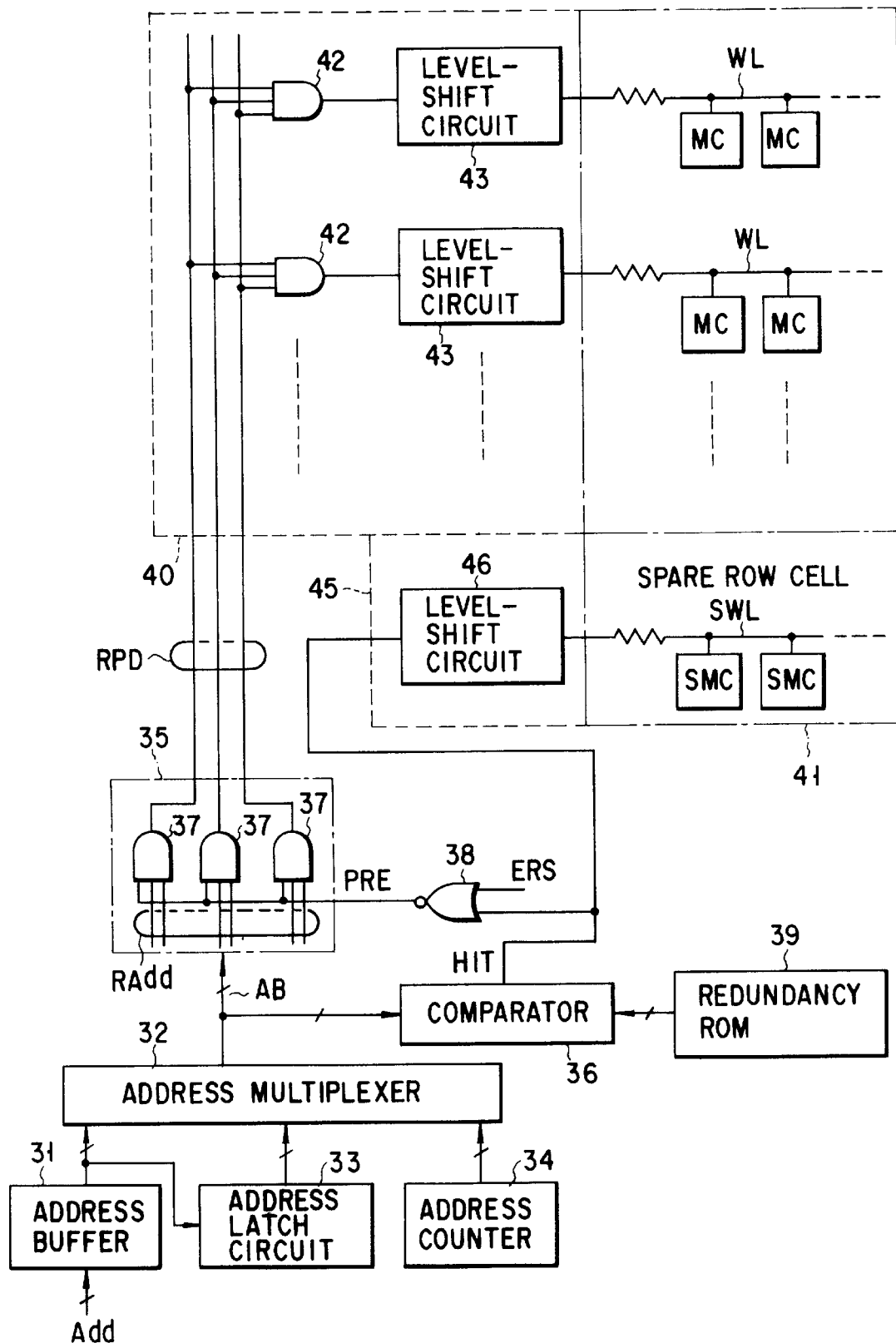
FIG. 11 is a circuit diagram showing a row decoder circuit and a peripheral circuit portion relating to the erasing operation, for illustrating an example of the construction obtained when the level-shift circuit of this invention is applied to the row decoder circuit of a negative gate erasable type flash memory.

FIG. 11 shows an example of the construction obtained when the level-shift circuit of this invention is applied to the row decoder circuit of a negative gate erasable type flash memory. The circuit shown in FIG. 11 contains a row decoder circuit in the flash memory and a peripheral circuit portion relating to the erasing operation. An address signal Add externally supplied is input to an address buffer 31 and an output of the address buffer 31 is supplied to an address multiplexer 32 and address latch circuit 33. An output of the address latch circuit 33 and an output of an address counter 34 are supplied to the address multiplexer 32 which in turn selects one of the outputs of the address buffer 31, address latch circuit 33 and address counter 34 and outputs the selected output to an internal address bus AB. An address signal output to the internal address bus AB is supplied to a row pre-decoder 35 and comparator 36. The row pre-decoder 35 is constructed by AND gates 37, 37, . . . which are supplied with a row address signal RAdd among the address signal supplied via the internal address bus AB. Further, each of the AND gates 37, 37, . . . is supplied with an activation signal PRE output from an NOR gate 38 for the row pre-decoder 35 and the operation thereof is controlled.

The comparator 36 compares an address supplied via the internal address bus AB with a defective address stored in a redundancy ROM 39 and outputs a coincidence signal HIT when the compared addresses coincide with each other. The redundancy ROM 39 stores addresses of the defective cells and the ROM 39 is designed to store bits of a number corresponding to the number of row addresses for row redundancy. On the other hand, in a case where the defective word line is replaced for each line, all of the row addresses are stored in the redundancy ROM 39. Further, in a case where the replacement of word lines is effected for every $2^n$ lines such as 2 rows, 4 rows, the number of addresses to be stored may be reduced by n bits. Data may be stored by use of a flash memory or a method of storing defective addresses by providing fuses of polysilicon and selectively melting the fuses by laser may be used.

Thus, defective addresses are previously stored in the redundancy ROM 39 and whether the selected address coincides with the defective address or not is always checked by the comparator 36. If the selected address coincides with the defective address, the coincidence signal HIT is set to the "H" level. As a result, the activation signal PRE is set to the "L" level to activate the pre-decoder 35 and set the defective row into the non-selected state, and a spare word line SWL is driven by an output of a level-shift circuit 46 of a spare row decoder 45 to substitute the spare cell. The replacement of the cells is effected in the same manner as in the EPROM. At the time of erasing, since the word lines WL are collectively operated and set into the non-selected state and subjected to the flash erasing process together with the spare row, no particular control by redundancy is effected.

The NOR gate 38 is supplied with the coincidence signal HIT and erasing signal ERS to inhibit the output of the row pre-decoder 35 (fix the output at the "L" level) in the erasing mode when the input address coincides with the defective address.

A row pre-decoder signal RPD output from the row pre-decoder 35 is supplied to a main decoder 40. In the main decoder 40, AND gates 42, 42, . . . and level-shift circuits 43, 43, . . . corresponding to the word lines WL of a memory cell array 41 are provided. As the level-shift circuit 43, the level-shift circuit shown in the first to fourth embodiments is used.

The memory cell array 41 is a cell block which is collectively and simultaneously erased, and although not shown in the drawing, the sources of the cell transistors are commonly connected in the array 41 and biased by an erasing potential at the erasing time. At the other operation time such as writing or readout time, the common sources are grounded. On the other hand, the drains of the cell transistors are commonly connected for each column to respective bit lines arranged to intersect the word lines WL. Since the drains set in the open state at the erasing time as described before, no special decoding operation is necessary and the explanation therefor is omitted here.

Figure 12:
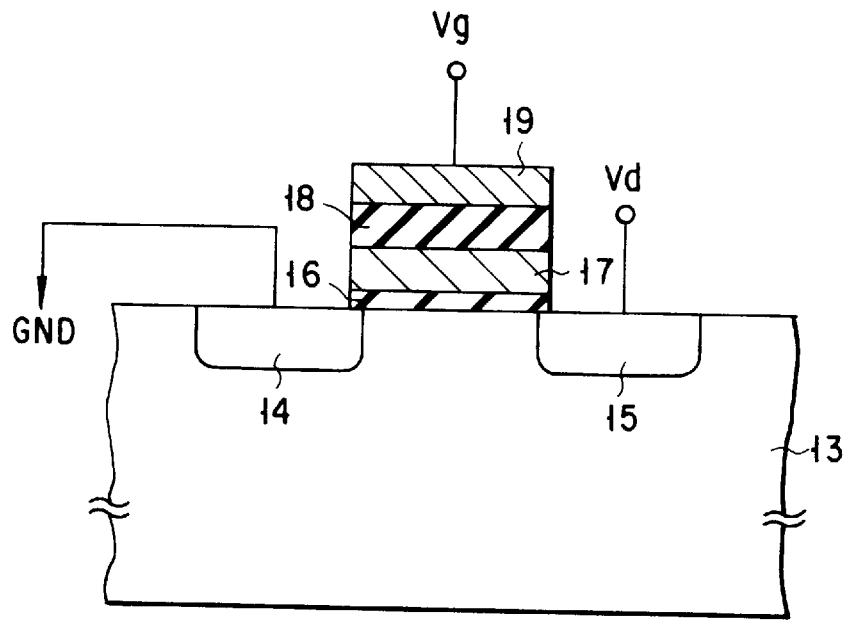
FIG. 12 is a cross sectional view for illustrating a voltage of application at the time of data writing in a cell transistor of the negative gate erasable type flash memory.
Figure 13:
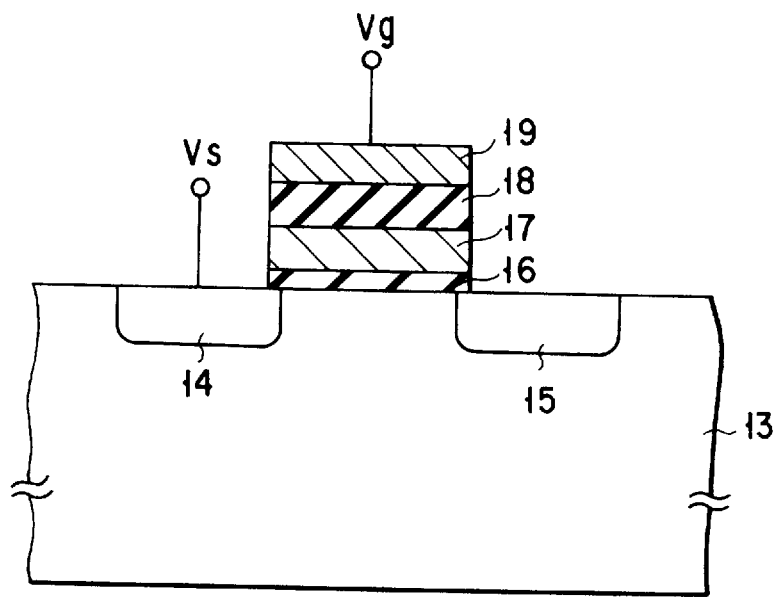
FIG. 13 is a cross sectional view for illustrating a voltage of application at the time of data erasing in a cell transistor of the negative gate erasable type flash memory.

In the memory cell array, cell transistors MC having the cross section as shown in FIGS. 12 and 13 are arranged on the rows and columns. FIG. 12 shows the relation of potentials applied at the time of data writing, and FIG. 13 shows the relation of potentials applied at the time of data erasing. That is, a source region 14 and drain region 15 of a second conductivity type are separately formed in the main surface area of a semiconductor substrate 13 of a first conductivity type. A tunnel oxide film 16, floating gate 17, insulative film (which is called an inter-polysilicon insulative film) 18 and control gate 19 are stacked on the channel region between the source region 14 and the drain region 15.

At the writing time, as shown in FIG. 12, the source region 14 is grounded, a potential Vg (Vg=Vpr>Vcc) and potential Vd (Vd>0) are respectively applied to the control gate 19 and drain region 15. With the application of the above potentials, hot electrons are injected into the floating gate 17 to write data. On the other hand, at the erasing time, as shown in FIG. 13, a positive high potential Vs (Vs>0) is applied to the source region 14 and a negative potential Vg (Vg=Ver<0) is applied to the control gate 19 to set up an intense electric field across the tunnel oxide film 16, thereby extracting electrons in the floating gate 17 by a tunnel current (this is called negative gate erasing). In the negative gate erasing, since a negative potential is applied to the control gate 19, the potential applied to the source region 14 can be suppressed to a lower level in comparison with a method of erasing data by applying a ground potential to the control gate (this is called a source erasing method).

The coincidence signal HIT output from the comparator 36 is supplied to the spare row decoder 45 as described above. In the spare row decoder 45, the level-shift circuit of one of the first to fourth embodiments is used and the spare word line SWL connected to the spare memory cell SMC is driven by an output of the circuit 46. In order to simplify the explanation, a case wherein one spare word line SWL is used is shown in FIG. 11, it is, of course, possible to use a plurality of spare word lines and select the word line by use of the spare row decoder 45.

Next, the operation of the above construction is schematically explained. At the time of readout or writing, it is necessary to select the word lines WL in the memory cell array 41 one at a time according to the row address Add. In the circuit shown in FIG. 11, the row address Add designated by an address counter or the like in the chip or an external input is decoded by the pre-decoder 35 and is then further decoded by the main decoder 40 to select one of the word lines WL.

The level-shift circuits 43, 46 are designed to effect the level-shift of both of the "H" level and "L" level in one stage, and the level-shift circuit 43 can effect the operation of latching an output signal of a corresponding one of the AND gates 42, 42, ... and the level-shift circuit 46 can effect the operation of latching a coincidence signal HIT. Further, the circuit can cope with a lowering in the power supply voltage without lowering the access speed. Therefore, the circuit is suitable for the negative gate erasable flash memory as shown in FIG. 11.

Figure 14:
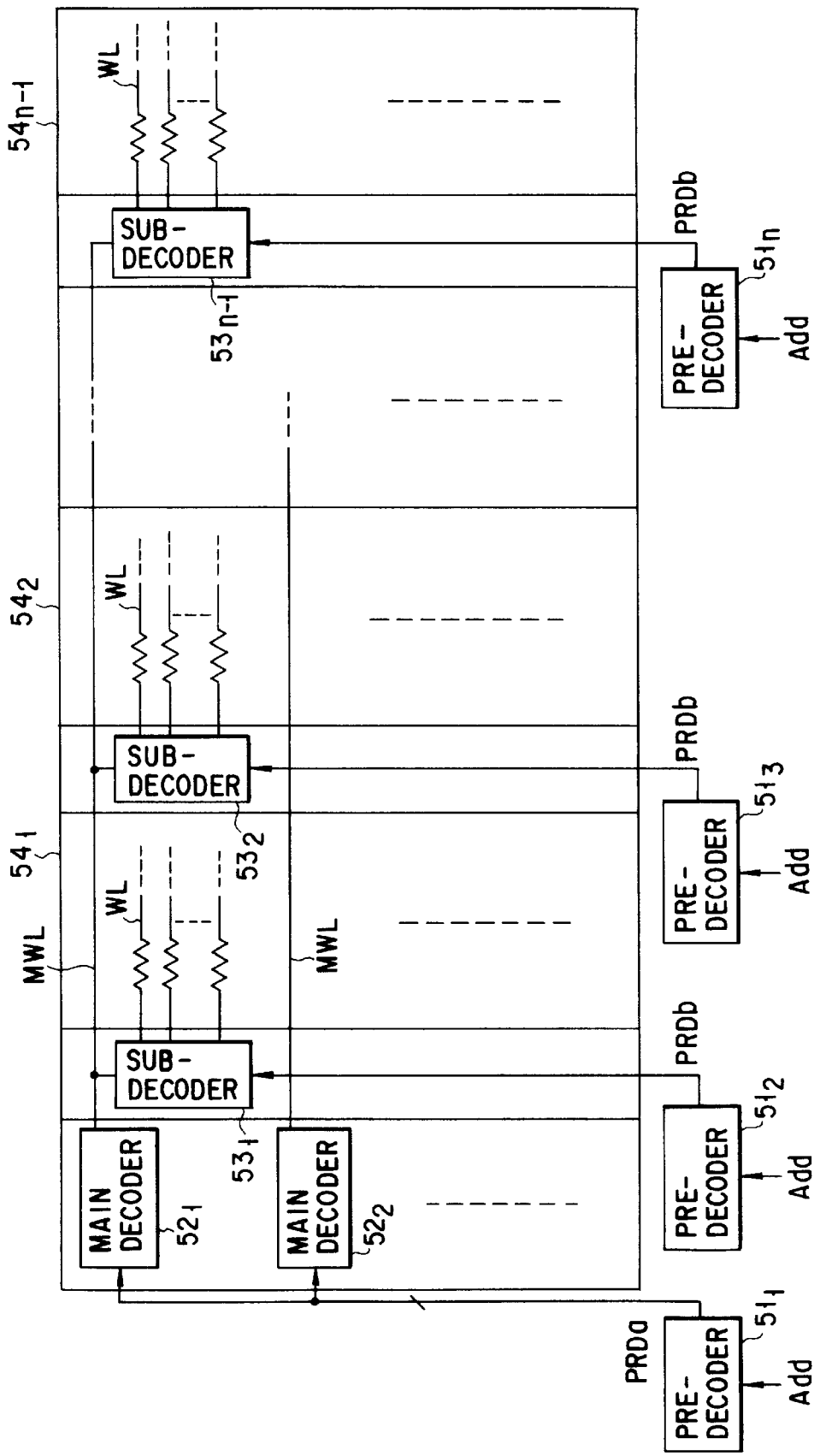
FIG. 14 is a circuit diagram showing an example in which the level-shift circuit of this invention is applied to a row decoder circuit of double word line structure, for illustrating a case wherein the level-shift circuit of this invention is applied to another row decoder circuit.

FIG. 14 is a circuit diagram showing an example in which the level-shift circuit of this invention is applied to another row decoder circuit which is the row decoder of a flash memory of double word line structure. The address signal Add is supplied to pre-decoders $51_1$, $51_2$, $51_3$, . . . , $51_n$ and an output signal PRDa of the pre-decoder $51_1$ is supplied to main decoders $52_1$, $52_2$, . . . are supplied to sub-decoders $53_1$, $53_2$, . . . , $53_{n-1}$. The memory cell array is divided into sub-arrays $54_1$, $54_2$, . . . , $54_{n-1}$ and main word lines MWL, MWL, . . . are arranged across the sub-arrays $54_1$, $54_2$, . . . , $54_{n-1}$. The main word lines MWL, MWL, . . . are connected to the sub-decoders $53_1$, $53_2$, . . . , $53_{n-1}$ and are respectively driven by the main decoders $52_1$, $52_2$, . . . In each of the sub-arrays $54_1$, $54_2$, . . . , $54_{n-1}$, word lines WL are provided. The word lines WL, WL, . . . are connected to memory cells (not shown) and are driven by the sub-decoders $53_1$, $53_2$, . . . , $53_{n-1}$.

Level-shift circuits having the same construction as one of the level conversion circuits shown in FIGS. 5, 7, 8 and 9 are provided in the pre-decoders $51_1$, $51_2$, . . . , $51_n$ and main decoders $52_1$, $52_2$, . . .

The address signals Add are supplied to the pre-decoders $51_1$, $51_2$, . . . , $51_n$ and decoded by the respective pre-decoders. The pre-decoder signal PRDa output from the pre-decoder $51_1$ is supplied to the main decoders $52_1$, $52_2$, . . . , and pre-decoder signals PRDb output from the pre-decoders $51_2$, $51_3$, . . . , $51_n$ are respectively supplied to the sub-decoders $53_1$, $53_2$, . . . , $53_{n-1}$ The word lines WL, WL, . . . are selected by the main decoders $52_1$, $52_2$, . . . and the word lines WL are selected by the sub-decoders $53_1$, $53_2$, . . . , $53_{n-1}$ according to the output signals of the main decoders $52_1$, $52_2$, . . . supplied to the main word lines WL, WL, . . . and pre-decoder signals PRDb output from the pre-decoders $51_2$, $51_3$, . . . , $51_n$.

FIG. 15 shows an example of the construction of main decoders $52_1$, $52_2$, . . . in the circuit shown in FIG. 14 with much attention given to a pair of main word lines MWLi, $\overline{MWLi}$. For example, the pre-decoder signal PRDa is decoded by a main decoder portion 55 constructed by an AND gate and a decoded output is supplied to a level-shift circuit 56. The level-shift circuit 56 has substantially the same construction as the circuit shown in FIG. 5, 7, 8 or 9 and shifts the level of an output signal of the main decoder portion 55 and supplies the level-shifted signal to the main word line MWLi. Further, an output signal of the level-shift circuit 56 is output to the main word line $\overline{MWLi}$ via an inverter 57 operated with the potentials $V_H$ and $V_L$ used as the power supply voltage.

FIG. 16 shows an example of the construction of the pre-decoders $51_2$, $51_3$, . . . , $51_n$ in the circuit shown in FIG. 14 with much attention given to the 1-bit pre-decoder signal PRDb. A pre-decoder portion 58 constructed by an AND gate is supplied with an address signal Add and an output signal of the pre-decoder portion 58 is supplied to a level-shift circuit 59. The level-shift circuit 59 has substantially the same construction as the circuit shown in FIG. 5, 7, 8 or 9, and shifts the level of an output signal of the pre-decoder portion 58 and outputs a pre-decoder signal PRDb.

FIG. 17 shows an example of the construction of the sub-decoders $53_1$, $53_2$, . . . , $53_{n-1}$ in the circuit shown in FIG. 15 with much attention given to one sub-array $54_1$. Each of the word lines WL in the sub-array $54_1$ is driven via one of a pair of transfer gates $60_1$ and $60_2$. The pre-decoder signal PRDb is supplied to one end of the transfer gate $60_1$ and the other end thereof is connected to the word line WL. One end of the other transfer gate $60_2$ is connected to the above word line WL and the other end thereof is applied with a potential $V_L$. The gates of an N-channel MOS transistor 61 and a P-channel MOS transistor 62 of the respective transfer gates $60_1$ and $60_2$ are connected to the main word line MWLi and the gates of a P-channel MOS transistor 63 and an N-channel MOS transistor 64 of the respective transfer gates $60_1$ and $60_2$ are connected to the main word line $\overline{MWLi}$.

In the row decoder circuit with the above double word line structure, the basic operation is the same as that of the row decoder circuit shown in FIG. 11, and the "H" level and "L" level can be converted in one stage by providing the level-shift circuit shown in the first to fourth embodiments in the row decoder circuit. Further, the operation of latching output signals of the AND gates 55, 58 can be effected and a lowering in the power supply voltage can be coped with without lowering the access speed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A level-shift circuit comprising:

a first inverting circuit operated with a voltage between a potential of a first potential supplying source and a potential of a second potential supplying source used as a power supply voltage;

a second inverting circuit having an input terminal connected to an output of said first inverting circuit and an output terminal connected to an input terminal of said first inverting circuit and operated with a voltage between the potential of the first potential supplying source and the potential of the second potential supplying source used as a power supply voltage;

first and second transistors of a first conductivity type whose current paths are serially connected between the input terminal of said first inverting circuit and a third potential supplying source, a gate of said second transistor being supplied with an input signal whose high level is set at a potential of a fourth potential supplying source and whose low level is set at a potential of the third potential supplying source;

third and fourth transistors of the first conductivity type whose current paths are serially connected between the input terminal of said second inverting circuit and the third potential supplying source;

a control circuit for shifting a low level of a first control signal to the potential of the second potential supplying source and supplying the level-shifted first control signal to gates of said first and third transistors to control the conduction states thereof, wherein the first control signal has substantially the same negative level as the level of the second potential supplying source when the potential of the second potential supplying source is changed to a negative level; and a logic circuit for supplying a logic signal to the gate of said fourth transistor in response to the input signal to control the conduction state thereof;

wherein an output signal is derived from at least one of the output terminals of said first and second inverting circuits.

2. A level-shift circuit according to claim 1, wherein each of said first and second inverter circuits is a complementary inverter including a fifth transistor of a second conductivity type having a source connected to the first potential supplying source, and a sixth transistor of the first conductivity type having a drain connected to a drain of said fifth transistor, a gate connected to a gate of said fifth transistor, and a source connected to the second potential supplying source.

3. A level-shift circuit according to claim 1, wherein each of said first and second inverter circuits is a complementary inverter including a fifth transistor of a second conductivity type having a source connected to the first potential supplying source, a sixth transistor of the first conductivity type having a drain connected to a drain of said fifth transistor and a gate supplied with a second control signal, and a seventh transistor of the first conductivity type having a drain connected to a source of said sixth transistor, a gate connected to a gate of said fifth transistor, and a source connected to the second potential supplying source.

4. A level-shift circuit according to claim 1, wherein said control circuit includes an inverter operated with a voltage between the potential of the third potential supplying source and the potential of the second potential supplying source used as a power supply voltage.

5. A level-shift circuit according to claim 1, wherein said logic circuit includes a complementary inverter having an input terminal supplied with the input signal and operated with a voltage between the potential of the third potential supplying source and the potential of the fourth potential supplying source used as a power supply voltage, for supplying an inverted signal of the input signal to the gate of said fourth transistor.

6. A level-shift circuit according to claim 1, wherein said logic circuit includes a NOR gate having a first input terminal supplied with the input signal and a second input terminal supplied with a third control signal and operated with a voltage between the potential of the third potential supplying source and the potential of the fourth potential supplying source used as a power supply voltage, for supplying a signal which is the logical NOR of the input signal and the third control signal to a gate of said fourth transistor.

7. A level-shift circuit according to claim 1, wherein cell transistors on a selected row of a negative gate erasable type flash memory are driven by supplying a row decoder signal as the input signal, supplying an erasing signal as the first control signal and supplying the output signal to the word line.

8. A level-shift circuit according to claim 7, wherein the potential of the third potential supplying source is at a ground potential level, the potential of the fourth potential supplying source is at a power supply potential level; the potential of the first potential supplying source is set higher than the power supply potential level and the potential of the second potential supplying source is set at the ground potential level at the writing time; and the potential of the first potential supplying source is set at the power supply potential level and the potential of the second potential supplying source is set lower than the ground potential level at the erasing time.

9. A level-shift circuit comprising:

a first MOS transistor of P-channel type having a source connected to a first potential supplying source;

a second MOS transistor of N-channel type having a drain connected to a drain of said first MOS transistor and a source connected to a second potential supplying source;

a third MOS transistor of P-channel type having a source connected to the first potential supplying source, a gate connected to a common connection node between the drains of said first and second MOS transistors, and a drain connected to gates of said first and second MOS transistors;

a fourth MOS transistor of N-channel type having a drain connected to the drain of said third MOS transistor, a source connected to the second potential supplying source, and a gate connected to the gate of said third MOS transistor;

fifth and sixth MOS transistors of N-channel type whose current paths are serially connected between the gates of said first and second MOS transistors and a third potential supplying source, a gate of said fifth MOS transistor being supplied with a control signal whose high level is set at the potential of the fourth potential supplying source and whose low level is set at the potential of the second potential supplying source and a gate of said sixth MOS transistor being supplied with an input signal whose high level is set at a potential of a fourth potential supplying source and whose low level is set at the potential of the third potential supplying source, wherein the control signal has substantially the same negative level as the level of the second potential supplying source when the potential of the second potential supplying source is changed to a negative level; and seventh and eighth MOS transistors of N-channel type whose current paths are serially connected between the gates of said third and fourth MOS transistors and the third potential supplying source, a gate of said seventh MOS transistor being supplied with the control signal and a gate of said eighth MOS transistor being supplied with the input signal;

wherein an output signal is derived from at least one of the common connection node between the drains of said first and second MOS transistors and the common connection node between the drains of said third and fourth MOS transistors.

10. A level-shift circuit according to claim 9, wherein cell transistors on a selected row of a negative gate erasable type flash memory are driven by supplying a row decoder signal as the input signal, supplying an erasing signal as the control signal and supplying the output signal to the word line.

11. A level-shift circuit according to claim 10, wherein the potential of the third potential supplying source is at a ground potential level, the potential of the fourth potential supplying source is at a power supply potential level; the potential of the first potential supplying source is set higher than the power supply potential level and the potential of the second potential supplying source is set at the ground potential level at the writing time; and the potential of the first potential supplying source is set at the power supply potential level and the potential of the second potential supplying source is set lower than the ground potential level at the erasing time.

12. A level-shift circuit comprising:

a first MOS transistor of P-channel type having a source connected to a first potential supplying source;

a second MOS transistor of N-channel type having a drain connected to a drain of said first MOS transistor and a gate supplied with a first control signal;

a third MOS transistor of N-channel type having a drain connected to a source of said second MOS transistor, a source connected to a second potential supplying source, and a gate connected to a gate of said first MOS transistor;

a fourth MOS transistor of P-channel type having a source connected to the first potential supplying source, a gate connected to a common connection node between the drains of said first and third MOS transistors, and a drain connected to the gates of said first and third MOS transistors;

a fifth MOS transistor of N-channel type having a drain connected to the drain of said fourth MOS transistor and a gate supplied with the first control signal;

a sixth MOS transistor of N-channel type having a drain connected to a source of said fifth MOS transistor, a source connected to the second potential supplying source and a gate connected to the gate of said fourth MOS transistor and the drains of said first and second MOS transistors;

seventh and eighth MOS transistors of N-channel type whose current paths are serially connected between the gates of said first and third MOS transistors and a third potential supplying source, a gate of said seventh MOS transistor being supplied with a second control signal whose high level is set at a potential of a fourth potential supplying source and whose low level is set at the potential of the second potential supplying source and a gate of said eighth MOS transistor being supplied with an input signal whose high level is set at the potential of the fourth potential supplying source and whose low level is set at the potential of the third potential supplying source; and ninth and tenth MOS transistors of N-channel type whose current paths are serially connected between the gates of said fourth and sixth MOS transistors and the third potential supplying source, a gate of said ninth MOS transistor being supplied with the second control signal and a gate of said tenth MOS transistor being supplied with the input signal;

wherein an output signal is derived from at least one of the common connection node between the drains of said first and second MOS transistors and the common connection node between the drains of said fourth and fifth MOS transistors.

13. A level-shift circuit according to claim 12, wherein cell transistors on a selected row of a negative gate erasable type flash memory are driven by supplying a row decoder signal as the input signal, supplying a latch signal as the first control signal, supplying an erasing signal as the second control signal and supplying the output signal to the word line.

14. A level-shift circuit according to claim 13, wherein the potential of the third potential supplying source is at a ground potential level, the potential of the fourth potential supplying source is at a power supply potential level; the potential of the first potential supplying source is set higher than the power supply potential level and the potential of the second potential supplying source is set at the ground potential level at the writing time; and the potential of the first potential supplying source is set at the power supply potential level and the potential of the second potential supplying source is set lower than the ground potential level at the erasing time.

15. A level-shift circuit comprising:

a first MOS transistor of P-channel type having a source connected to a first potential supplying source;

a second MOS transistor of N-channel type having a drain connected to a drain of said first MOS transistor and a source connected to a second potential supplying source;

a third MOS transistor of P-channel type having a source connected to the first potential supplying source, a gate connected to a common connection node between the drains of said first and second MOS transistors, and a drain connected to gates of said first and second MOS transistors;

a fourth MOS transistor of N-channel type having a drain connected to the drain of said third MOS transistor, a source connected to the second potential supplying source, and a gate connected to the gate of said third MOS transistor;

fifth and sixth MOS transistors of N-channel type whose current paths are serially connected between the gates of said first and second MOS transistors and a third potential supplying source, a gate of said fifth MOS transistor being supplied with a first control signal whose high level is set at the potential of the fourth potential supplying source and whose low level is set at the potential of the second potential supplying source and a gate of said sixth MOS transistor being supplied with an input signal whose high level is set at the potential of the fourth potential supplying source and whose low level is set at the potential of the third potential supplying source, wherein the first control signal has substantially the same negative level as the level of the second potential supplying source when the potential of the second potential supplying source is changed to a negative level; and seventh and eighth MOS transistors of N-channel type whose current paths are serially connected between the gates of said third and fourth MOS transistors and the third potential supplying source, a gate of said seventh MOS transistor being supplied with the first control signal and a gate of said eighth MOS transistor being supplied with a signal which is the logical NOR of the input signal and a second control signal;

wherein an output signal is derived from at least one of the common connection node between the drains of said first and second MOS transistors and the common connection node between the drains of said third and fourth MOS transistors.

16. A level-shift circuit according to claim 15, wherein cell transistors on a selected row of a negative gate erasable type flash memory are driven by supplying a row decoder signal as the input signal, supplying an erasing signal as the first control signal, supplying a latch signal as the second control signal and supplying the output signal to the word line.

17. A level-shift circuit according to claim 16, wherein the potential of the third potential supplying source is at a ground potential level, the potential of the fourth potential supplying source is at a power supply potential level; the potential of the first potential supplying source is set higher than the power supply potential level and the potential of the second potential supplying source is set at the ground potential level at the writing time; and the potential of the first potential supplying source is set at the power supply potential level and the potential of the second potential supplying source is set lower than the ground potential level at the erasing time.

18. A level-shift circuit comprising:

a first MOS transistor of P-channel type having a source connected to a first potential supplying source;

a second MOS transistor of N-channel type having a drain connected to a drain of said first MOS transistor and a gate supplied with a first control signal;

a third MOS transistor of N-channel type having a drain connected to a source of said second MOS transistor and a source connected to a second potential supplying source;

a fourth MOS transistor of P-channel type having a source connected to the first potential supplying source, a gate connected to a common connection node between the drains of said first and third MOS transistors, and a drain connected to gates of said first and third MOS transistors;

a fifth MOS transistor of N-channel type having a drain connected to the drain of said fourth MOS transistor and a gate supplied with the first control signal;

a sixth MOS transistor of N-channel type having a drain connected to a source of said fifth MOS transistor, a source connected to the second potential supplying source and a gate connected to the gate of said fourth MOS transistor;

seventh and eighth MOS transistors of N-channel type whose current paths are serially connected between the gates of said first and third MOS transistors and a third potential supplying source, a gate of said seventh MOS transistor being supplied with a second control signal whose high level is set at a potential of a fourth potential supplying source and whose low level is set at the potential of the second potential supplying source and a gate of said eighth MOS transistor being supplied with an input signal whose high level is set at the potential of the fourth potential supplying source and whose low level is set at the potential of the third potential supplying source; and ninth and tenth MOS transistors of N-channel type whose current paths are serially connected between the gates of said fourth and sixth MOS transistors and the third potential supplying source, a gate of said ninth MOS transistor being supplied with the second control signal and a gate of said tenth MOS transistor being supplied with a signal which is the logical NOR of the input signal and the first control signal;

wherein an output signal is derived from at least one of the common connection node between the drains of said first and second MOS transistors and the common connection node between the drains of said fourth and fifth MOS transistors.

19. A level-shift circuit according to claim 18, wherein cell transistors on a selected row of a negative gate erasable type flash memory are driven by supplying a row decoder signal as the input signal, supplying a latch signal as the first control signal, supplying an erasing signal as the second control signal and supplying the output signal to the word line.

20. A level-shift circuit according to claim 19, wherein the potential of the third potential supplying source is at a ground potential level, the potential of the fourth potential supplying source is at a power supply potential level; the potential of the first potential supplying source is set higher than the power supply potential level and the potential of the second potential supplying source is set at the ground potential level at the writing time; and the potential of the first potential supplying source is set at the power supply potential level and the potential of the second potential supplying source is set lower than the ground potential level at the erasing time.

21. A method for outputting level-shifted data using a level shift circuit, the level-shift circuit comprising:

a first MOS transistor of P-channel type having a source connected to a first node;

a second MOS transistor of N-channel type having a drain connected to a drain of said first MOS transistor and a gate supplied with a first control signal;

a third MOS transistor of N-channel type having a drain connected to a source of said second MOS transistor, a source connected to a second node, and a gate connected to a gate of said first MOS transistor;

a fourth MOS transistor of P-channel type having a source connected to the first node, a gate connected to a common connection node between the drains of said first and third MOS transistors, and a drain connected to the gates of said first and third MOS transistors;

a fifth MOS transistor of N-channel type having a drain connected to the drain of said fourth MOS transistor and a gate supplied with the first control signal;

a sixth MOS transistor of N-channel type having a drain connected to a source of said fifth MOS transistor, a source connected to the second node and a gate connected to the gate of said fourth MOS transistor and the drains of said first and second MOS transistors;

seventh and eighth MOS transistors of N-channel type whose current paths are serially connected between the gates of said first and third MOS transistors and a third node, a gate of said seventh MOS transistor being supplied with a second control signal and a gate of said eighth MOS transistor being supplied with data; and ninth and tenth MOS transistors of N-channel type whose current paths are serially connected between the gates of said fourth and sixth MOS transistors and the third node, a gate of said ninth MOS transistor being supplied with the second control signal and a gate of said tenth MOS transistor being supplied with inverted data;

wherein level-shifted data is output from at least one of the common connection node between the drains of said first and second MOS transistors and the common connection node between the drains of said fourth and fifth MOS transistors;

the method comprising a first mode including first to third steps:

said first step including the substeps of:
setting the first control signal to an "H" level to turn ON the second and fifth MOS transistors,
applying a positive potential to the first node,
applying a ground potential to the second node,
applying the ground potential to the third node,
applying a power supply potential as the second control signal to turn ON the seventh and ninth MOS transistors, and
supplying the data and the inverted data thereof to the gates of the eighth and tenth MOS transistors to turn ON one of the eighth and tenth MOS transistors and turn OFF the other of the eighth and tenth MOS transistors;

said second step including the substeps of:
setting the first control signal to the "H" level to turn ON the second and fifth MOS transistors,
applying a positive potential to the first node,
applying a negative potential higher than a reference potential to the second node,
applying the ground potential to the third node, and
applying a potential equal to a potential of the second node as the second control signal to turn OFF the seventh and ninth MOS transistors; and said third step including the substeps of:
setting the first control signal to an "L" level to turn OFF the second and fifth MOS transistors,
applying the ground potential to the first node,
applying a negative potential lower than the reference potential to the second node,
applying the ground potential to the third node, and
applying a potential equal to the potential of the second node as the second control signal to turn OFF the seventh and ninth MOS transistors.

22. A method for outputting level-shifted data using a level shift circuit according to claim 21, wherein the first mode is an erasing mode in a semiconductor memory device.

23. A method for outputting level-shifted data using a level shift circuit according to claim 21, further comprising a second mode;

said second mode comprising the steps of:
setting the first control signal to the "L" level to turn OFF the second and fifth MOS transistors,
applying a positive potential higher than the power supply potential to the first node,
applying the ground potential to the second node,
applying the ground potential to the third node,
applying the power supply potential as the second control signal to turn ON the seventh and ninth MOS transistors, and
supplying the data and the inverted data thereof to the gates of the eighth and tenth MOS transistors to turn ON one of the eighth and tenth MOS transistors and turn OFF the other of the eighth and tenth MOS transistors.

24. A method for outputting level-shifted data using a level shift circuit according to claim 23, wherein the second mode is a writing mode in a semiconductor memory device.

25. A method for outputting level-shifted data using a level shift circuit according to claim 23, further comprising a third mode;

said third mode comprising the steps of:
setting the first control signal to the "H" level to turn ON the second and fifth MOS transistors,
applying a positive potential higher than the power supply potential to the first node,
applying the ground potential to the second node,
applying the ground potential to the third node,
applying the power supply potential as the second control signal to turn ON the seventh and ninth MOS transistors, and
supplying the data and the inverted data thereof to the gates of the eighth and tenth MOS transistors to turn ON one of the eighth and tenth MOS transistors and turn OFF the other of the eighth and tenth MOS transistors.

26. A method for outputting level-shifted data using a level shift circuit according to claim 25, wherein the third mode is a verify mode in a semiconductor memory device.

27. A method for outputting level-shifted data using a level shift circuit according to claim 25, further comprising a fourth mode;

said fourth mode comprising the steps of:
setting the first control signal to the "H" level to turn ON the second and fifth MOS transistors,
applying a positive potential higher than the power supply potential to the first node,
applying the ground potential to the second node,
applying the ground potential to the third node,
applying the power supply potential as the second control signal to turn ON the seventh and ninth MOS transistors, and
supplying the input signal and the inverted signal thereof to the gates of the eighth and tenth MOS transistors to turn ON one of the eighth and tenth MOS transistors and turn OFF the other of the eighth and tenth MOS transistors.

28. A method for outputting level-shifted data using a level shift circuit according to claim 27, wherein the fourth mode is a readout mode in a semiconductor memory device.

29. A method for outputting level-shifted data using a level shift circuit, the level-shift circuit comprising:
a first MOS transistor of P-channel type having a source connected to a first node;
a second MOS transistor of N-channel type having a drain connected to a drain of said first MOS transistor and a source connected to a second node;
a third MOS transistor of P-channel type having a source connected to the first node, a gate connected to a common connection node between the drains of said first and second MOS transistors, and a drain connected to gates of said first and second MOS transistors;
a fourth MOS transistor of N-channel type having a drain connected to the drain of said third MOS transistor, a source connected to the second node, and a gate connected to the gate of said third MOS transistor;
fifth and sixth MOS transistors of N-channel type whose current paths are serially connected between the gates of said first and second MOS transistors and a third node, a gate of said fifth MOS transistor being supplied with a control signal and a gate of said sixth MOS transistor being supplied with data; and seventh and eighth MOS transistors of N-channel type whose current paths are serially connected between the gates of said third and fourth MOS transistors and the third node, a gate of said seventh MOS transistor being supplied with the control signal and a gate of said eighth MOS transistor being supplied with inverted data;

wherein level-shifted data is output from at least one of the common connection node between the drains of said first and second MOS transistors and the common connection node between the drains of said third and fourth MOS transistors;

the method comprising a first mode including first to third steps:

said first step including the substeps of:
applying a positive potential to the first node,
applying a ground potential to the second node,
applying the ground potential to the third node,
applying a power supply potential as the control signal to turn ON the fifth and seventh MOS transistors, and
supplying the data and the inverted data thereof to the gates of the sixth and eighth MOS transistors to turn ON one of the sixth and eighth MOS transistors and turn OFF the other of the sixth and eighth MOS transistors;

said second step including the substeps of:
applying a positive potential to the first node,
applying a negative potential higher than a reference potential to the second node,
applying the ground potential to the third node, and
applying a potential equal to a potential of the second node as the control signal to turn OFF the fifth and seventh MOS transistors; and said third step including the substeps of:
applying the ground potential to the first node,
applying a negative potential lower than the reference potential to the second node,
applying the ground potential to the third node, and
applying a potential equal to a potential of the second node as the control signal to turn OFF the fifth and seventh MOS transistors.

30. A method for outputting level-shifted data using a level shift circuit according to claim 29, wherein the first mode is an erasing mode in a semiconductor memory device.

31. A method for outputting level-shifted data using a level shift circuit according to claim 29, further comprising a second mode;

said second mode comprising the steps of:
applying a positive potential higher than the power supply potential to the first node,
applying the ground potential to the second node,
applying the ground potential to the third node,
applying the power supply potential as the control signal to turn ON the fifth and seventh MOS transistors, and
supplying the data and the inverted data thereof to the gates of the sixth and eighth MOS transistors to turn ON one of the sixth and eighth MOS transistors and turn OFF the other of the sixth and eighth MOS transistors.

32. A method for outputting level-shifted data using a level shift circuit according to claim 31, wherein the second mode is a writing mode in a semiconductor memory device.

33. A method for outputting level-shifted data using a level shift circuit according to claim 31, further comprising a third mode;

said third mode comprising the steps of:
applying a positive potential higher than the power supply potential to the first node,
applying the ground potential to the second node,
applying the ground potential to the third node,
applying the power supply potential as the control signal to turn ON the fifth and seventh MOS transistors, and
supplying the input signal and the inverted signal thereof to the gates of the sixth and eighth MOS transistors to turn ON one of the sixth and eighth MOS transistors and turn OFF the other of the sixth and eighth MOS transistors.

34. A method for outputting level-shifted data using a level shift circuit according to claim 33, wherein the third mode is a verify mode in a semiconductor memory device.

35. A method for outputting level-shifted data using a level shift circuit according to claim 33, further comprising a fourth mode;

said fourth mode comprising the steps of:
applying a positive potential higher than the power supply potential to the first node,
applying the ground potential to the second node,
applying the ground potential to the third node,
applying the power supply potential as the control signal to turn ON the fifth and seventh MOS transistors, and
supplying the input signal and the inverted signal thereof to the gates of the sixth and eighth MOS transistors to turn ON one of the sixth and eighth MOS transistors and turn OFF the other of the sixth and eighth MOS transistors.

36. A method for outputting level-shifted data using a level shift circuit according to claim 35, wherein the fourth mode is a readout mode in a semiconductor memory device.

37. A method for outputting level-shifted data using a level shift circuit, the level-shift circuit comprising:

a first MOS transistor of P-channel type having a source connected to a first node;

a second MOS transistor of N-channel type having a drain connected to a drain of said first MOS transistor and a gate supplied with a first control signal;

a third MOS transistor of N-channel type having a drain connected to a source of said second MOS transistor and a source connected to a second node;

a fourth MOS transistor of P-channel type having a source connected to the first node, a gate connected to a common connection node between the drains of said first and third MOS transistors, and a drain connected to gates of said first and third MOS transistors;

a fifth MOS transistor of N-channel type having a drain connected to the drain of said fourth MOS transistor and a gate supplied with the first control signal;

a sixth MOS transistor of N-channel type having a drain connected to a source of said fifth MOS transistor, a source connected to the second node and a gate connected to the gate of said fourth MOS transistor;

seventh and eighth MOS transistors of N-channel type whose current paths are serially connected between the gates of said first and third MOS transistors and a third node, a gate of said seventh MOS transistor being supplied with a second control signal and a gate of said eighth MOS transistor being supplied with data; and ninth and tenth MOS transistors of N-channel type whose current paths are serially connected between the gates of said fourth and sixth MOS transistors and the third node, a gate of said ninth MOS transistor being supplied with the second control signal and a gate of said tenth MOS transistor being supplied with a signal which is the logical NOR of the data and the first control signal;

wherein level-shifted data is output from at least one of the common connection node between the drains of said first and second MOS transistors and the common connection node between the drains of said third and fourth MOS transistors;

the method comprising a first mode including first and second steps:

said first step including the substeps of:
supplying data of "L" level to the gate of the eighth MOS transistor and setting the first control signal to the "H" level to turn OFF the tenth MOS transistor,
setting the first control signal to the "H" level to turn ON the second and fifth MOS transistors,
applying a positive potential to the first node,
applying a ground potential to the second node,
applying the ground potential to the third node, and
applying a power supply potential as the second control signal to turn ON the fifth and seventh MOS transistors; and said second step including the substeps of:
supplying data of "H" level to the gate of the eighth MOS transistor to turn ON the eighth MOS transistor,
applying a positive potential to the first node,
applying the ground potential to the second node,
applying the ground potential to the third node, and
applying a power supply potential as the second control signal to turn ON the seventh and ninth MOS transistors;
wherein a common connection node between the drains of the first and second MOS transistors is set to the power supply potential and a common connection node between the drains of the fourth and fifth MOS transistors is set to the ground potential.

38. A method for outputting level-shifted data using a level shift circuit according to claim 37, wherein the first mode is an erasing mode in a semiconductor memory device and is an operation for holding a word line which is not used for erasing in the selected state.

39. A method for outputting level-shifted data using a level shift circuit according to claim 37, further comprising a second mode;

said second mode comprising the steps of:
setting the first control signal to the "L" level to turn OFF the second and fifth MOS transistors,
applying a positive potential higher than the power supply potential to the first node,
applying the ground potential to the second node,
applying the ground potential to the third node,
applying the power supply potential as the second control signal to turn ON the seventh and ninth MOS transistors, and
supplying the data and the inverted data thereof to the gates of the eighth and tenth MOS transistors to turn ON one of the eighth and tenth MOS transistors and turn OFF the other of the eighth and tenth MOS transistors.

40. A method for outputting level-shifted data using a level shift circuit according to claim 39, wherein the second mode is a writing mode in a semiconductor memory device.

41. A method for outputting level-shifted data using a level shift circuit according to claim 39, further comprising a third mode;

said third mode comprising the steps of:
setting the first control signal to the "L" level to turn OFF the second and fifth MOS transistors,
applying the power supply potential to the first node,
applying the ground potential to the second node,
applying the ground potential to the third node,
applying the power supply potential as the second control signal to turn ON the seventh and ninth MOS transistors, and
supplying the data and the inverted data thereof to the gates of the eighth and tenth MOS transistors to turn ON one of the eighth and tenth MOS transistors and turn OFF the other of the eighth and tenth MOS transistors.

42. A method for outputting level-shifted data using a level shift circuit according to claim 41, wherein the third mode is a readout mode in a semiconductor memory device.

43. A method for outputting level-shifted data using a level-shift circuit, the level-shift circuit comprising:
a first MOS transistor of P-channel type having a source connected to a first node;
a second MOS transistor of N-channel type having a drain connected to a drain of said first MOS transistor and a source connected to a second node;
a third MOS transistor of P-channel type having a source connected to the first node, a gate connected to a common connection node between the drains of said first and second MOS transistors, and a drain connected to gates of said first and second MOS transistors;
a fourth MOS transistor of N-channel type having a drain connected to the drain of said third MOS transistor, a source connected to the second node, and a gate connected to the gate of said third MOS transistor;
fifth and sixth MOS transistors of N-channel type whose current paths are serially connected between the gates of said first and second MOS transistors and a third node, a gate of said fifth MOS transistor being supplied with a first control signal and a gate of said sixth MOS transistor being supplied with data; and
seventh and eighth MOS transistors of N-channel type whose current paths are serially connected between the gates of said third and fourth MOS transistors and the third node, a gate of said seventh MOS transistor being supplied with the first control signal and a gate of said eighth MOS transistor being supplied with a signal which is the logical NOR of the data and a second control signal;

wherein level-shifted data is output from at least one of the common connection node between the drains of said first and second MOS transistors and the common connection node between the drains of said third and fourth MOS transistors;

the method comprising a first mode including first and second steps:

said first step including the substeps of:
supplying data of "L" level to the gate of the sixth MOS transistor and setting the second control signal to the "H" level to turn OFF the eighth MOS transistor,
applying a positive potential to the first node,
applying a ground potential to the second node,
applying the ground potential to the third node, and
applying a power supply potential as the first control signal to turn ON the fifth and seventh MOS transistors; and said second step including the substeps of:
supplying data of "H" level to the gate of the sixth MOS transistor to turn ON the sixth MOS transistor,
applying a positive potential to the first node,
applying the ground potential to the second node,
applying the ground potential to the third node, and
applying the power supply potential as the first control signal to turn ON the fifth and seventh MOS transistors;
wherein a common connection node between the drains of the first and second MOS transistors is set to the power supply potential and a common connection node between the drains of the fourth and fifth MOS transistors is set to the ground potential, and
wherein the first control signal has substantially the same negative level as the level of the second node when the potential of the second node is changed to a negative level.

44. A method for outputting level-shifted data using a level shift circuit according to claim 43, wherein the first mode is an erasing mode in a semiconductor memory device and is an operation for holding a word line which is not used for erasing in the selected state.

45. A method for outputting level-shifted data using a level shift circuit according to claim 44, further comprising a second mode;
said second mode comprising the steps of:
setting the second control signal to the "L" level,
applying a positive potential higher than the power supply potential to the first node,
applying the ground potential to the second node,
applying the ground potential to the third node,
applying the power supply potential as the first control signal to turn ON the fifth and seventh MOS transistors, and
supplying the data to the gate of the sixth MOS transistor,
supplying a signal which is a logical NOR of the data and the second control signal to the gate of the eighth MOS transistor to turn ON one of the sixth and eighth MOS transistors and turn OFF the other of the sixth and eighth MOS transistors.

46. A method for outputting level-shifted data using a level shift circuit according to claim 45, wherein the second mode is a writing mode in a semiconductor memory device.

47. A method for outputting level-shifted data using a level shift circuit according to claim 45, further comprising a third mode;
said third mode comprising the steps of:
supplying the "L" level signal as the second control signal,
applying the power supply potential to the first node,
applying the ground potential to the second node,
applying the ground potential to the third node,
applying the power supply potential as the first control signal to turn ON the seventh and ninth MOS transistors, and
supplying the data to the gates of the sixth and eighth MOS transistors to turn ON one of the sixth and eighth MOS transistors and turn OFF the other of the sixth and eighth MOS transistors.

48. A method for outputting level-shifted data using a level shift circuit according to claim 47, wherein the third mode is a readout mode in a semiconductor memory device.

* * * * *